(12) United States Patent
Shim et al.

(10) Patent No.: US 8,742,466 B2
(45) Date of Patent: Jun. 3, 2014

(54) THREE-DIMENSIONAL SEMICONDUCTOR DEVICE INCLUDING A MOLD STRUCTURE PROVIDING GAP REGIONS AND AN INTERCONNECTION STRUCTURE INCLUDING A PLURALITY OF INTERCONNECTION PATTERNS FORMED IN THE GAP REGIONS

(75) Inventors: Jae-Joo Shim, Suwon-si (KR); Hansoo Kim, Suwon-si (KR); Wonseok Cho, Suwon-si (KR); Jaehoon Jang, Seongnam-si (KR); Woojin Cho, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 331 days.

(21) Appl. No.: 12/953,748

(22) Filed: Nov. 24, 2010

(65) Prior Publication Data

US 2011/0147801 A1    Jun. 23, 2011

(30) Foreign Application Priority Data

Dec. 18, 2009 (KR) .................. 10-2009-0126854

(51) Int. Cl.
*H01L 23/52* (2006.01)
(52) U.S. Cl.
USPC .............. 257/211; 257/E29.309; 438/591
(58) Field of Classification Search
USPC ................. 257/211, E29.309; 438/591
See application file for complete search history.

(56) References Cited

U.S. PATENT DOCUMENTS

| | | | |
|---|---|---|---|
| 2008/0173928 A1 | 7/2008 | Arai et al. | |
| 2008/0173932 A1 | 7/2008 | Kidoh et al. | |
| 2009/0121271 A1 | 5/2009 | Son et al. | |
| 2010/0020608 A1* | 1/2010 | Kamigaichi et al. | 365/185.05 |
| 2010/0034028 A1* | 2/2010 | Katsumata et al. | 365/185.28 |
| 2010/0109065 A1 | 5/2010 | Oh et al. | |
| 2010/0109071 A1* | 5/2010 | Tanaka et al. | 257/324 |
| 2011/0065270 A1 | 3/2011 | Shim et al. | |
| 2011/0092038 A1 | 4/2011 | Choi et al. | |

FOREIGN PATENT DOCUMENTS

| | | |
|---|---|---|
| JP | 06-338602 | 12/1994 |
| JP | 2008-159699 | 7/2008 |
| JP | 2008-171918 | 7/2008 |
| JP | 2009-117843 | 5/2009 |
| KR | 1020080058251 | 6/2008 |
| KR | 1020090047614 | 5/2009 |

* cited by examiner

*Primary Examiner* — Thao X Le
*Assistant Examiner* — Matthew Gordon
(74) *Attorney, Agent, or Firm* — F. Chau & Associates, LLC

(57) ABSTRACT

Provided are a three-dimensional semiconductor device and a method of fabricating the same. The three-dimensional semiconductor device may include a mold structure for providing gap regions and an interconnection structure including a plurality of interconnection patterns disposed in the gap regions. The mold structure may include interlayer molds defining upper surfaces and lower surfaces of the interconnection patterns and sidewall molds defining sidewalls of the interconnection patterns below the interlayer molds.

19 Claims, 30 Drawing Sheets

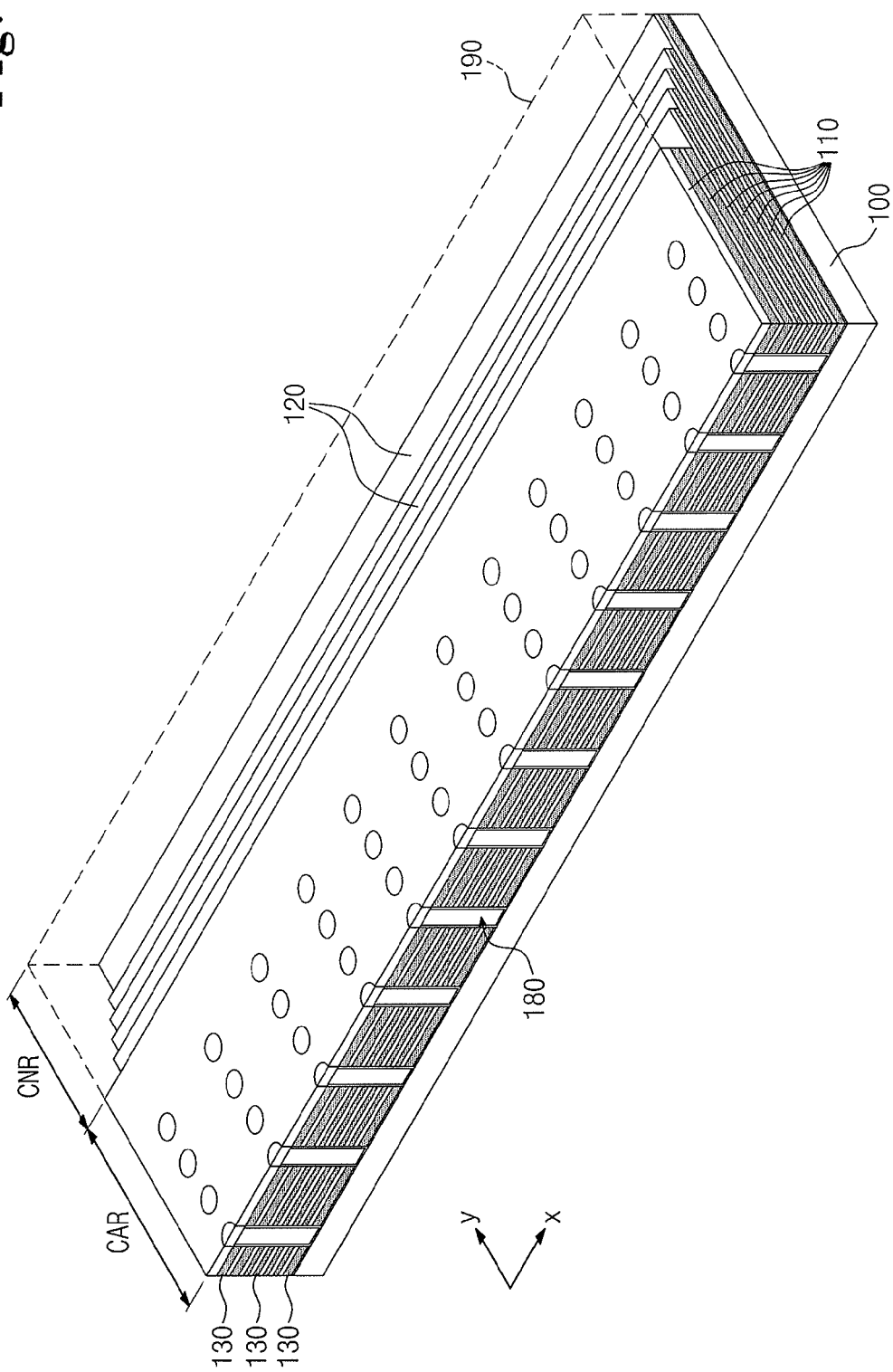

THREE-DIMENSIONAL SEMICONDUCTOR DEVICE INCLUDING A MOLD STRUCTURE PROVIDING GAP REGIONS AND AN INTERCONNECTION STRUCTURE INCLUDING A PLURALITY OF INTERCONNECTION PATTERNS FORMED IN THE GAP REGIONS

CROSS-REFERENCE TO RELATED APPLICATIONS

This U.S. non-provisional patent application claims priority under 35 U.S.C. §119 to Korean Patent Application 10-2009-0126854, filed on Dec. 18, 2009, the entire disclosure of which is hereby incorporated by reference herein in its entirety.

BACKGROUND

The present disclosure herein relates to a three-dimensional semiconductor device and to a method of fabricating the three-dimensional semiconductor memory device.

Higher integration of semiconductor devices may be required to satisfy consumer demands for superior performance and inexpensive prices. In the case of semiconductor memory devices, since their integration may be an important factor in determining product price, increased integration may especially be required. In the case of typical two-dimensional or planar semiconductor memory devices, since their integration may be mainly determined by the area occupied by a unit memory cell, integration may be significantly influenced by the level of fine pattern forming technology. However, since extremely expensive equipments may be needed for increasing pattern fineness, integration of two-dimensional semiconductor memory devices is increasing but still may be limited.

To overcome such a limitation, three-dimensional semiconductor memory devices having three-dimensionally arranged memory cells have been proposed. However, to mass-produce three-dimensional semiconductor devices, process technology may be required that can achieve manufacturing cost per bit lower than that of two-dimensional memory devices, and reliable product characteristics.

Thus, there is need in the art for a three-dimensional semiconductor device having reliable product characteristics such as structural stability and for low cost methods of fabricating the same.

SUMMARY

The present disclosure may provide a method of forming interconnections of a three-dimensional semiconductor device with a reduced manufacturing cost.

The present disclosure may also provide a method of forming interconnections of a three-dimensional semiconductor device capable of providing a structural stability.

The present disclosure may further provide a three-dimensional semiconductor device of which manufacturing cost is low.

The present disclosure may further provide a three-dimensional semiconductor device of which interconnection patterns have structural stability and are arranged three-dimensionally.

Embodiments of the inventive concept may provide a three-dimensional semiconductor device comprising sidewall molds horizontally isolating interconnection patterns. Specifically, the three-dimensional semiconductor device comprises: a mold structure providing gap regions and an interconnection structure comprising the plurality of interconnection patterns formed in the gap regions. The mold structure comprises interlayer molds defining upper surfaces and lower surfaces of the interconnection patterns and the sidewall molds defining sidewalls of the interconnection patterns below the interlayer molds In some embodiments, the interlayer molds may be thicker in a region adjacent to the sidewall mold than in a region adjacent to the interconnection pattern, and the width of an interlayer mold is broader than a width of the sidewall mold.

In other embodiments, the mold structure may comprise a plurality of partial mold structures horizontally isolated in the cell array region. The interconnection structure may comprise a plurality of partial interconnection structures comprising the plurality of interconnection patterns that are sequentially stacked. Two partial interconnection structures, which are horizontally isolated by the sidewall molds, may be arranged in one partial mold structure.

In still other embodiments, the interconnection structure may further comprise connection patterns sequentially stacked in the connection region. Each of the connection patterns may comprise: an interconnecting portion horizontally connecting the interconnection patterns to each other and a contact pad portion horizontally protruding from the interconnecting portion. The area of the contact pad portions of the connection patterns decreases, as the distance between the contact pad portions and the substrate increases.

In even other embodiments, the interconnecting portion may intersect the interconnection patterns and connects the interconnection patterns to each other. The contact pad portion may have the major axis parallel to the major axis of the interconnection patterns. The widths of the contact pad portions measured along a direction intersecting the major axes of the interconnection patterns may be substantially the same as each other. The number of contact pad portions respectively forming the connection patterns may be two. In yet other embodiments, the interconnection structure may comprise at least two interconnection patterns, one interconnecting portion, and at least two contact pad portions. The width of the contact pad portion measured along a direction intersecting the major axes of the interconnection patterns may be substantially the same as the width of the interconnecting portion measured along a direction of the major axis of the interconnection pattern.

In other embodiments of the inventive concept, a three-dimensional semiconductor device includes at least one mold structure providing gap regions and partial interconnection structures comprising a plurality of interconnection patterns which are sequentially stacked. The at least one mold structure includes a plurality of partial mold structures. The interconnection patterns are disposed in the gap regions, respectively, and the mold structure comprises interlayer molds vertically isolating the interconnection patterns and sidewall molds horizontally isolating the interconnection patterns. Moreover, two partial interconnection structures are disposed in one partial mold structure.

In other embodiment of the inventive concept, a three-dimensional semiconductor device includes a substrate comprising a cell array region and a connection region, at least one mold structure providing gap regions and disposed on the substrate and an interconnection structure including interconnection patterns disposed in the gap regions. Each of the interconnection patterns includes a plurality of electrode portions disposed in the cell array region, an interconnecting portion disposed in the connection region and horizontally connecting the electrode portions to each other; and at least one contact pad portion horizontally protruding from the interconnecting portion. The number of electrode portions included in the interconnection pattern is larger than the number of contact pad portions included in a corresponding interconnection pattern.

In other embodiments of the inventive concept, an interconnection forming method of a three-dimensional semiconductor device comprises: foaming a mold layer structure comprising interlayer mold layers and sidewall mold layers sequentially and alternately disposed on a substrate, forming trenches defining interlayer molds and preliminary sidewall molds sequentially and alternately disposed by patterning the mold layer structure, forming sidewall molds defining recessed regions between the interlayer molds by recessing sidewalls of the preliminary sidewall molds horizontally and forming an interconnection structure comprising interconnection patterns disposed in the recessed regions.

In further embodiments, the forming of the recessed regions may comprise horizontally recessing sidewalls of the preliminary sidewall molds at a depth smaller than half of a gap between the trenches.

In still further embodiments, the substrate may comprise a cell array region disposed with a plurality of active structures parallel to each other and each of the active structures comprises a plurality of active patterns perforated through the interlayer molds and connected to the substrate. The trenches may be formed on both sides of a pair of active structures adjacent to each other.

In even further embodiments, the forming of the trenches may comprise forming a pair of first trenches and a plurality of second trenches disposed between the pair of first trenches. The length of the first trenches may be longer than a length of the second trenches.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 10 through 12, FIG. 13A, FIG. 14A, and FIG. 15A are perspective views illustrating a method of fabricating a three-dimensional memory device according to a second embodiment of the inventive concept;

DETAILED DESCRIPTION OF THE EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

[First Embodiment]

Figure 6:
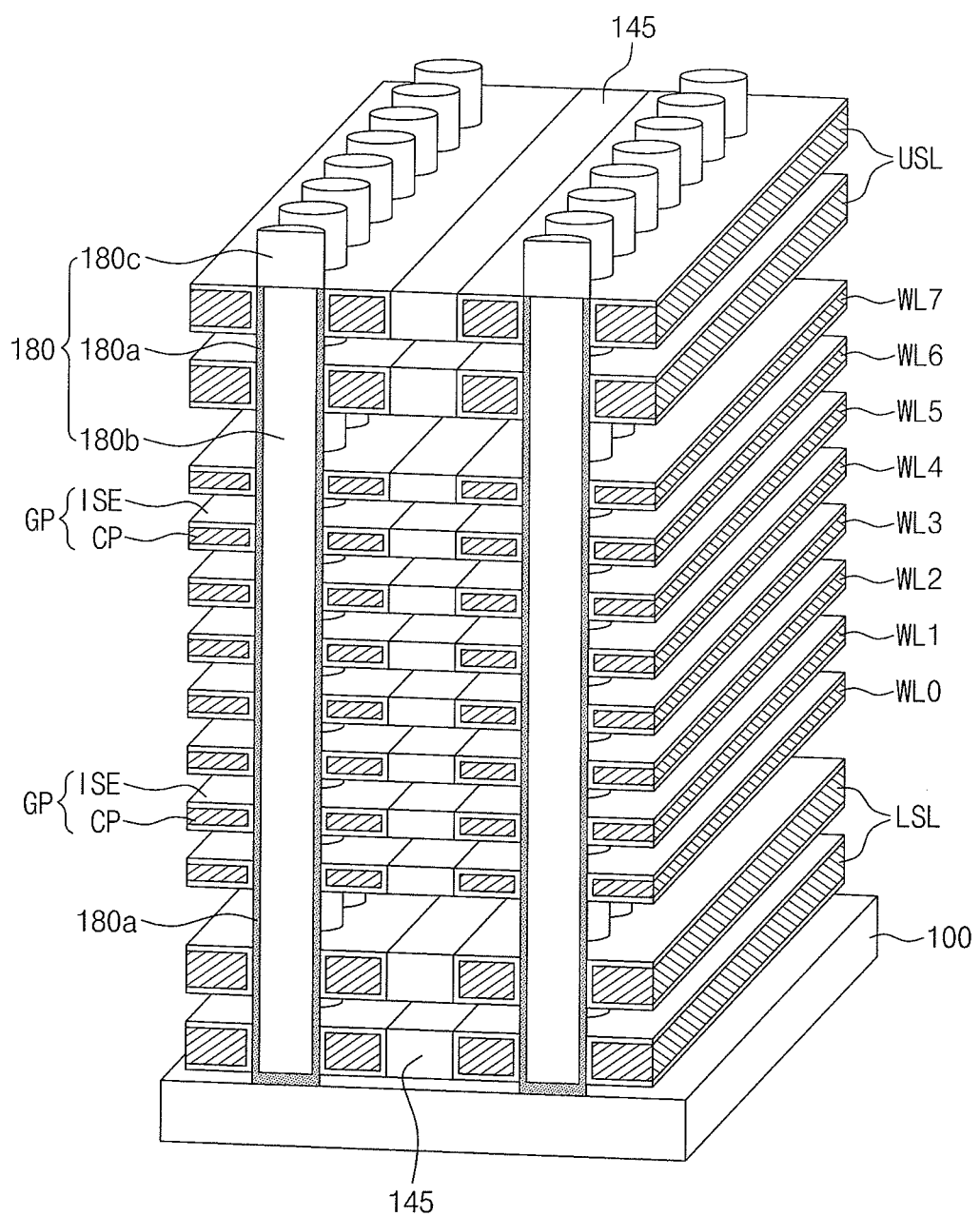
FIGS. 6 through 8 are perspective views illustrating parts of the three-dimensional semiconductor memory device in more detail according to the first embodiment of the inventive concept.
Figure 7:
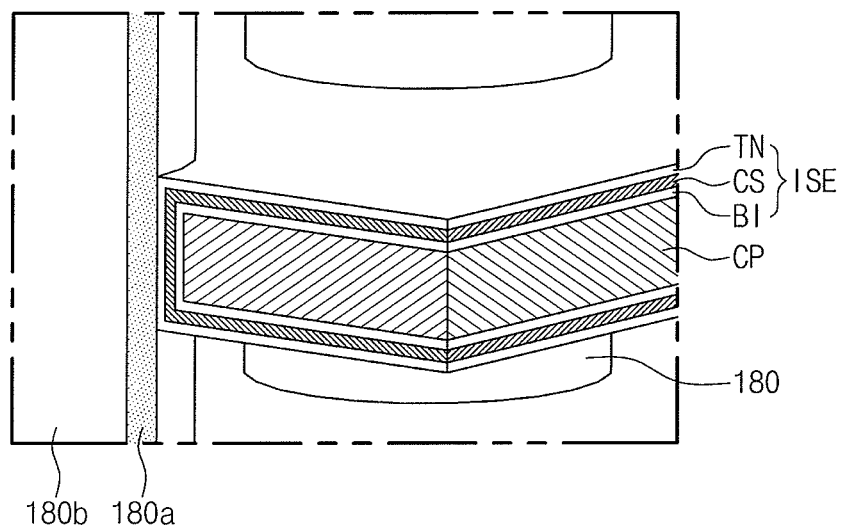
Figure 8:
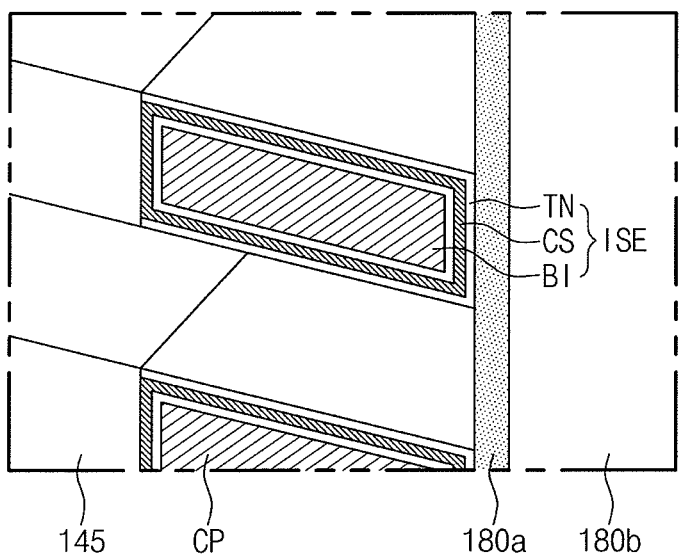

FIGS. 1 through 5 are perspective views illustrating a method of fabricating a three-dimensional semiconductor device according to a first embodiment of the inventive concept. FIGS. 6 through 8 are perspective views illustrating parts of the three-dimensional semiconductor device in more detail according to a first embodiment of the inventive concept.

Figure 1:
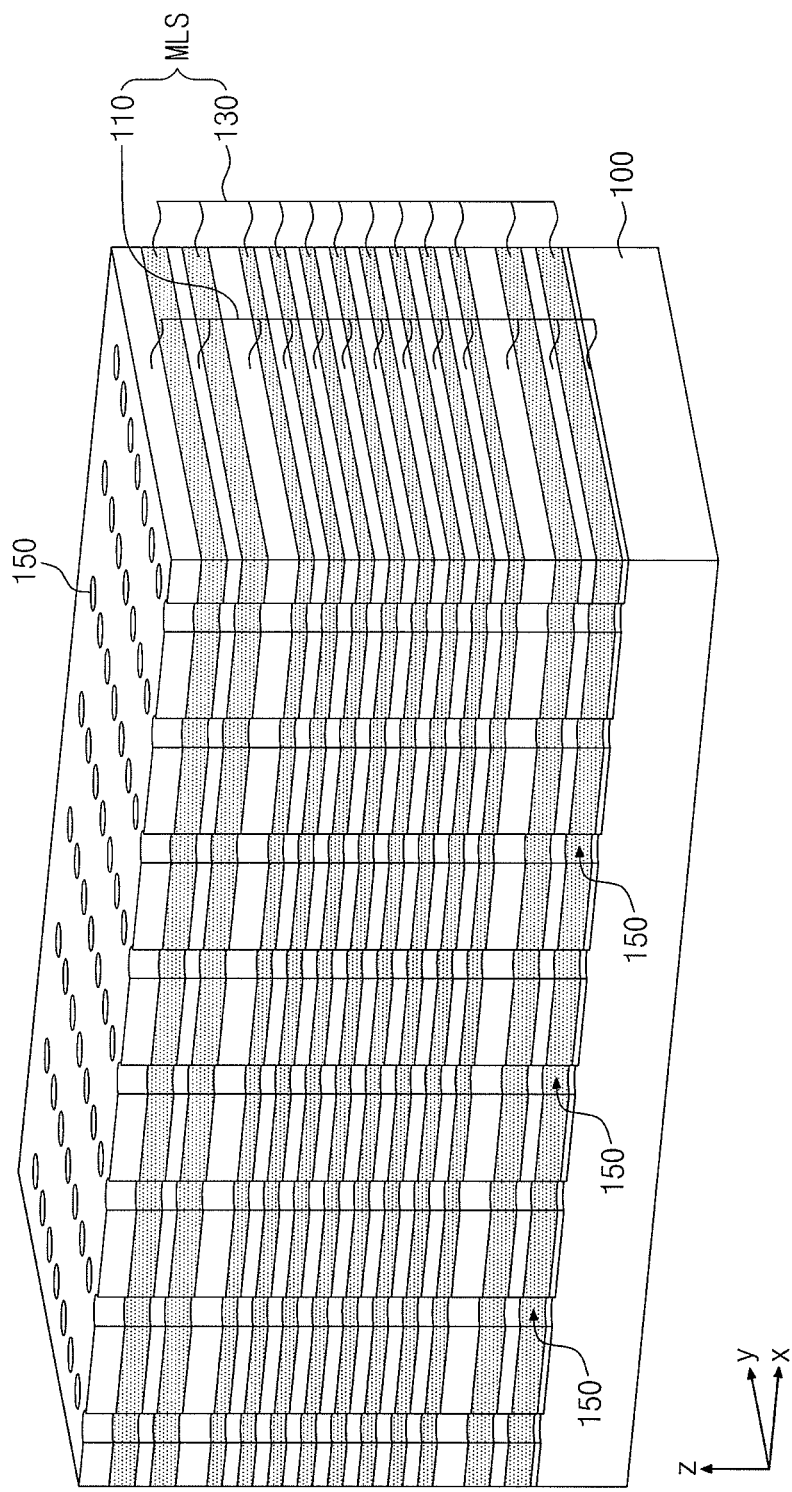
FIGS. 1 through 5 are perspective views illustrating a method of fabricating a three-dimensional semiconductor memory device according to a first embodiment of the inventive concept.

Referring to FIG. 1, a molding layer structure MLS is formed on a substrate 100, and then is patterned to form active openings 150 for exposing the upper surface of the substrate 100.

For example, the substrate 100 may be formed of one of semiconductor materials (for example, a silicon wafer), an insulating material (for example, glass), and a semiconductor or conductive member covered with an insulating film. The substrate 100 may have the upper surface parallel to an xy plane. The active openings 150 may be formed two-dimensionally on the substrate 100 or the xy plane.

The molding layer structure MLS may include interlayer mold layers 110 and sidewall mold layers 130 sequentially and alternately stacked. The sidewall mold layers 130 may be formed of a material capable of being etched with an etch selectivity to the interlayer mold layers 110. The sidewall mold layer 130 may be formed of a material that can be selectively etched while minimizing the etching of the interlayer mold layer 110. As known, such etch selectivity can quantitatively be expressed as a ratio of an etching speed of the sidewall mold layer 130 to an etching speed of the interlayer mold layer 110. According to an embodiment of the inventive concept, the sidewall mold layer 130 may be formed of one of materials having an etch selectivity of, for example, about 1:10 to about 1:200 (more particularly, 1:30 to 1:100) to the interlayer mold layer 110. For example, the interlayer mold layers 110 may be a silicon oxide layer, and the sidewall mold layers 130 may be a silicon nitride layer.

Figure 2:
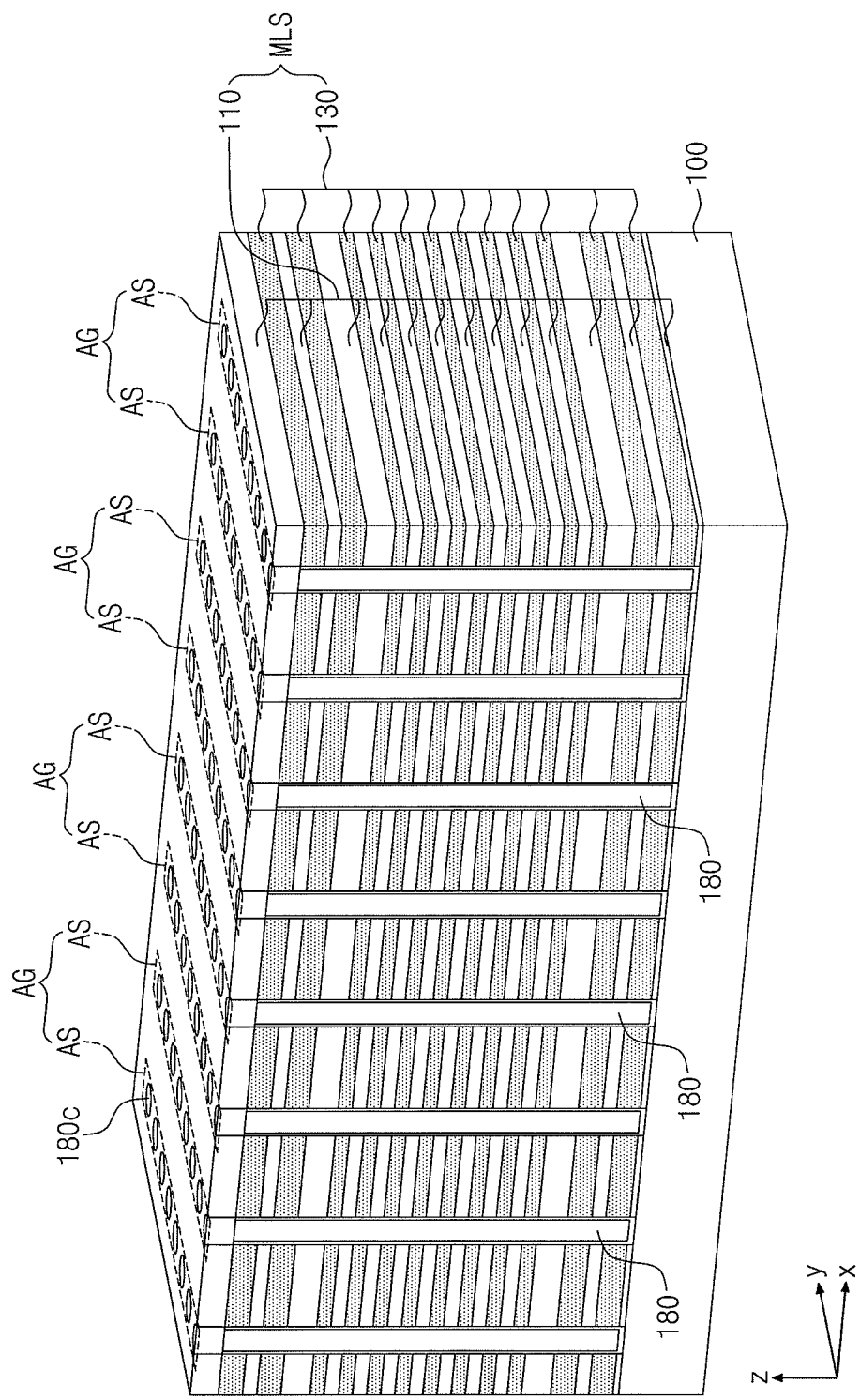

Referring to FIG. 2, the active patterns 180 are formed in the active opening 150. The active patterns 180 may contain one of materials with semiconductor characteristics. For example, as illustrated in FIG. 6, each of the active patterns 180 may include a semiconductor pattern 180a covering conformally the inner wall of the active opening 150 and a buried insulating pattern 180b filling the active opening 150 in which the semiconductor pattern 180a is formed.

The semiconductor pattern 180a may be a semiconductor material with a polycrystalline structure formed by chemical vapor deposition (for example, polysilicon). In this case, as explained above, the semiconductor pattern 180a may cover conformally the inner wall of the active opening 150. However, for example, the semiconductor pattern 180a may be one of single-crystalline silicon, organic semiconductor layers, and carbon nanostructures and may be formed by one of chemical vapor depositions and epitaxial techniques.

The buried insulating pattern 180b may contain at least one of insulating materials. For example, the buried insulating pattern 180b may be a silicon oxide layer or an insulating material formed by spin-on-glass (SOG) technique. According to an embodiment, before the buried insulating pattern 180b is formed, hydrogen annealing may further be performed under a gas atmosphere containing hydrogen and deuterium to treat thermally a resultant structure with the semiconductor pattern 180a. Such hydrogen annealing may cure crystal defects that may exist in the semiconductor pattern 180a.

As illustrated in FIGS. 2 and 6, each of the active patterns 180 may further include a junction pattern 180c disposed above the semiconductor pattern 180a. The junction pattern 180c may be formed of a semiconductor material having a characteristic different from that of the semiconductor pattern 180a in at least one of a conductive type and an impurity concentration. For example, the semiconductor pattern 180a may be a p-type or intrinsic semiconductor and the junction pattern 180c may be an n+ semiconductor.

On the other hand, the active patterns 180 may form active structures AS or active groups AG. For example, since the active patterns 180 are arranged two-dimensionally, the positions of the active patterns 180 may readily be described using the Cartesian coordinates. For example, each of the active structures AS may include a plurality of the active patterns 180 disposed at the positions described by substantially the same x coordinate and y coordinates different from each other. Moreover, each of the active groups AG may be constituted by two active structures AS that are adjacent to each other but are not included in other active groups. The terms of "active structure" and "active group" will be used with these meanings below.

Figure 3:
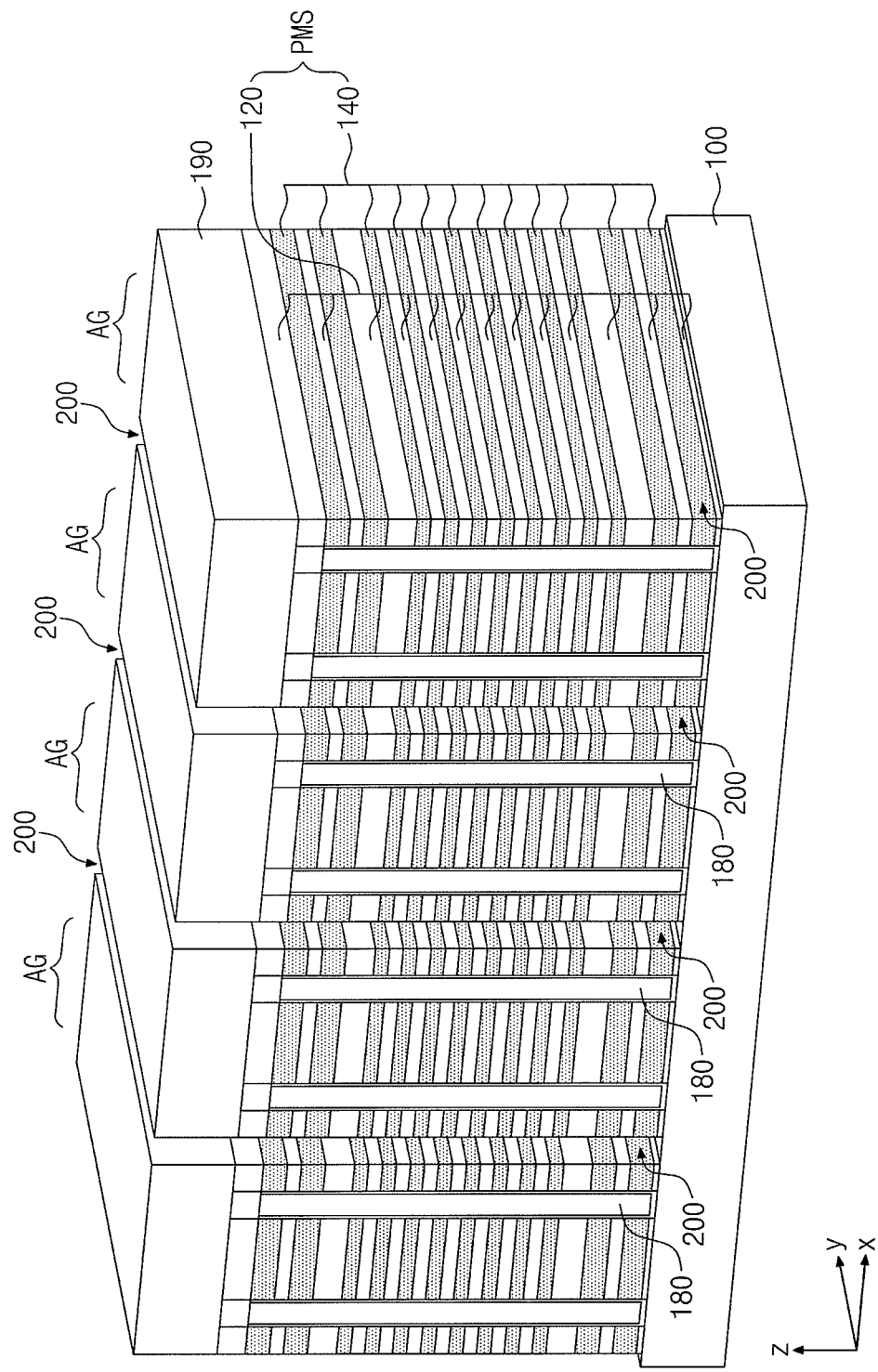

Referring to FIG. 3, the molding layer structure MLS is patterned to form trenches 200 defining a preliminary mold structure PMS. According to this embodiment, each trench 200 may be formed between the active groups AG. That is, two active structures AS may be formed between one pair of trenches 200 adjacent to each other.

The preliminary mold structure PMS may include the interlayer molds 120 and preliminary sidewall molds 140 that are sequentially and alternately stacked. The trenches 200 may substantially be formed through the molding layer structure MLS to expose the upper surface of the substrate 100. Therefore, as illustrated, the sidewalls of the interlayer molds 120 and the preliminary sidewall molds 140 may be exposed by the trenches 200.

According to a modified example of the inventive concept, the trenches 200 may be formed in such a way such that some layers of the molding layer structure MLS (for example, the lowermost layer) remain under the trenches 200. As illustrated in FIG. 3, a capping layer 190 covering the molding layer structure MLS may further be formed above the active patterns 180, before the trenches 200 are formed. The capping layer 190 may be used as a hard mask in an etching process of forming the trenches 200.

Figure 4:
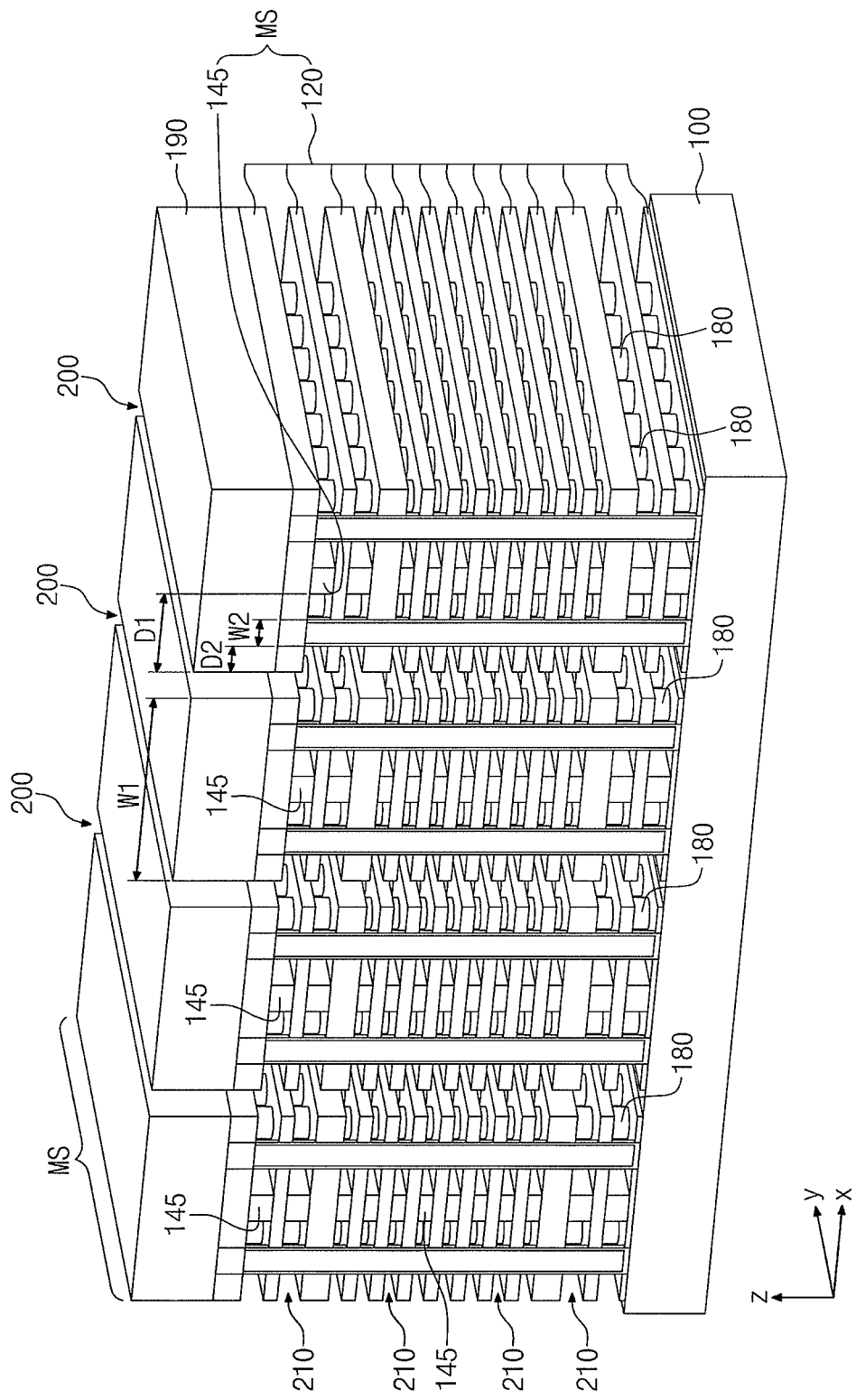

Referring to FIG. 4, the sidewalls of the preliminary sidewall molds 140 exposed by the trenches 200 are selectively and horizontally etched to foam sidewall molds 145 that form a mold structure MS together with the interlayer molds 120. As illustrated, recessed regions 210 may be formed between the interlayer molds 120 as a result of this horizontal etching. That is, the recessed regions 210 may be gap regions between the interlayer molds 120 which are horizontally extended from the trench 200 to expose the active patterns 180 and the sidewall molds 145.

Figure 9:
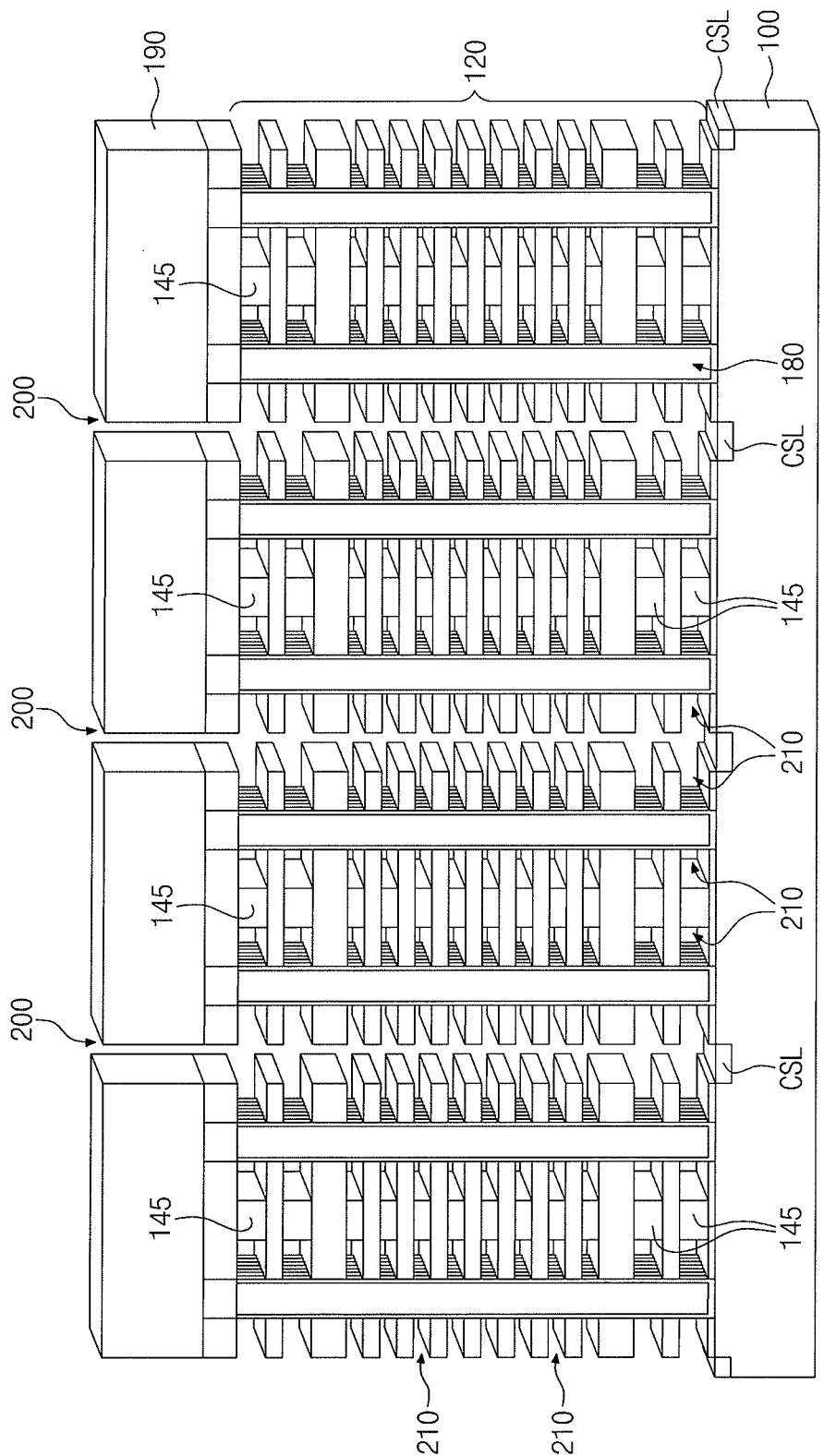
FIG. 9 is a perspective view illustrating a three-dimensional semiconductor memory device according to a modified example of the inventive concept.

For example, as illustrated in FIG. 9, a vertical boundary of the recessed regions 210 is defined by the interlayer molds 120 and a horizontal boundary of the recessed regions 210 is defined by the sidewall molds 145 and the trenches 200. In addition, an internal boundary of the recessed regions 210 is defined by the active patterns 180.

The forming of the recessed regions 210 may include a step of horizontally etching the preliminary sidewall molds 140 using an etching recipe having an etch selectivity with respect to the interlayer molds 120 and the active patterns 180. For example, when the preliminary sidewall molds 140 are a silicon nitride layer and the interlayer molds 120 are a silicon oxide layer, this horizontal etching may be performed using an etchant containing phosphoric acid.

In the horizontal etching according to this embodiment of the inventive concept, an etching depth D1 may be smaller than the half of a width W1 of the interlayer molds 120. Accordingly, the sidewall molds 145 may not be removed completely but may remain between the interlayer molds 120.

When the sidewall molds 145 remain between the interlayer molds 120, it is possible to prevent a technical difficulty such as a variation in the interval between the interlayer molds 120 or deformation of the mold structure. That is, the sidewall molds 145 may not only serve as molds defining the recessed regions 210 but also serve as supporting elements preventing the difficulty of a variation in the interval between the interlayer molds 120 during the horizontal etching.

According to an embodiment of the inventive concept, the etching depth D1 may be larger than a sum of a distance D2 between the active pattern 180 and the trench 200 and a width W2 of the active pattern 180. In this case, the sidewall of the active pattern 180 may completely be exposed between the interlayer molds 120. According to another embodiment of the inventive concept, however, the etching depth D1 may be larger than the distance D2 and it may be smaller than the sum of the distance D2 and the width W2. In this case, the sidewall of the active pattern 180 may be exposed partially.

Figure 5:
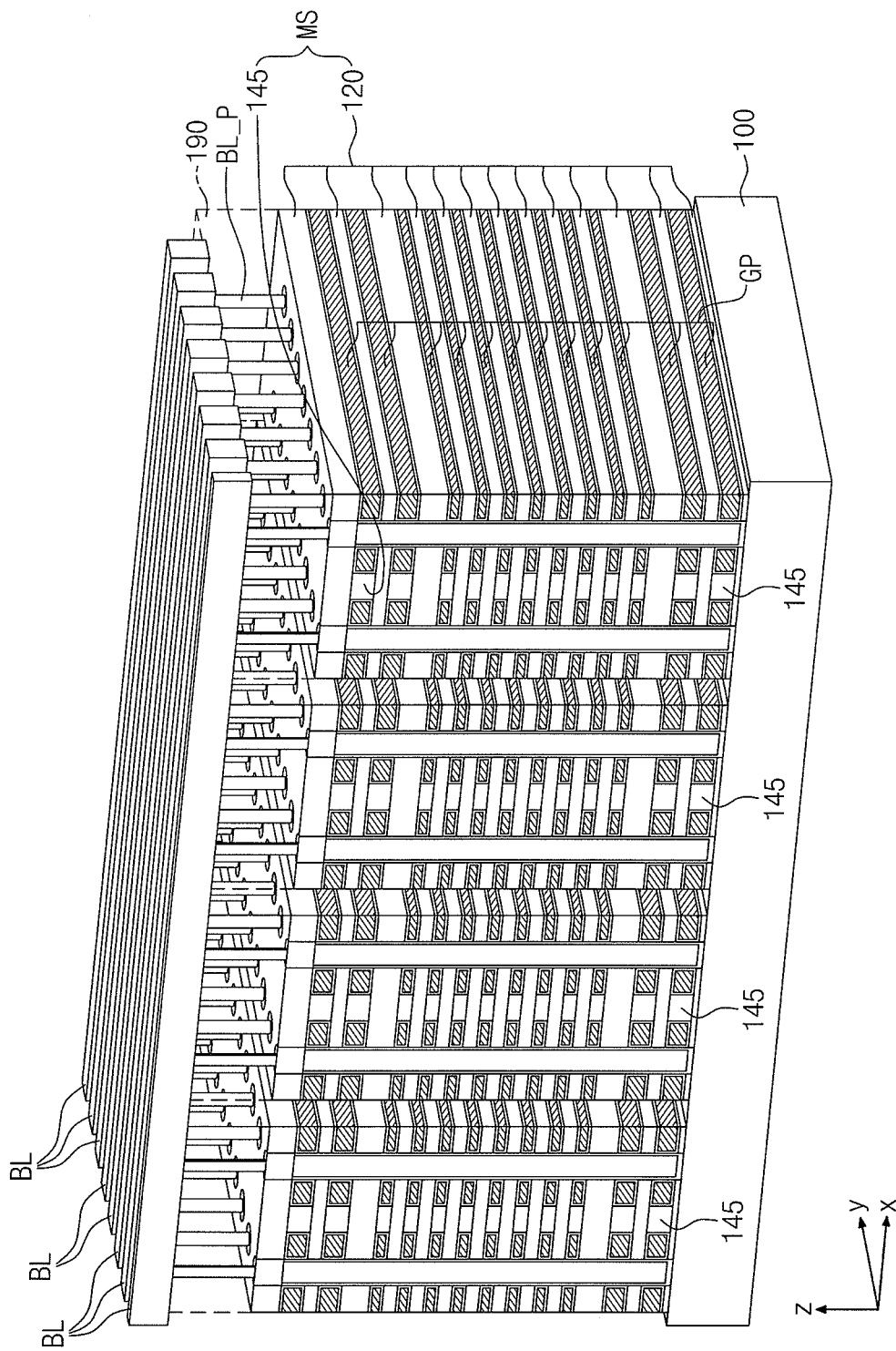

Referring to FIG. 5, gate patterns GP are formed to fill the recessed regions 210, and then bit lines BL are formed to be connected to the active patterns 180.

Each of the gate patterns GP may include an information storing element ISE and a conductive pattern CP sequentially filling the inner wall of the recessed region 210, as illustrated in FIG. 6. The forming of the gate patterns GP may include sequentially forming the information storing element ISE and a conductive layer covering the trenches 200 and the recessed regions 210 and removing the conductive layer in the trench 200 to remain partially the conductive pattern CP in the recessed regions 210. On the other hand, the trench 200 in which the conductive layer is removed may be filled with one of insulating materials.

When a Flash memory device is realized according to the technical spirit of the inventive concept, as illustrated in FIGS. 7 and 8, the information storing element ISE may include a charge storing layer CS and may further include a tunnel insulating layer TN interposed between the charge storing layer CS and the active pattern 180 and a blocking insulating layer (BI) interposed between the charge storing layer CS of the information storing element ISE and the conductive pattern CP. For example, the charge storing layer CS may be one of insulating layers with high trap site density and insulating layers containing conductive nanoparticles. According to an embodiment, the tunnel insulating layer TN may be formed of one of materials with a band gap larger than that of the charge storing layer CS, and the blocking insulating layer BI may be formed of one of materials with a band gap smaller than that of the tunnel insulating layer TN and larger than that of the charge storing layer CS. For example, the tunnel insulating layer TN may be a silicon oxide layer and the blocking insulating layer BI may be one of high-k layers such as an aluminum oxide layer and a hafnium oxide layer. According to a modified example of the inventive concept, the blocking insulating layer BI may be a multi-layer layer including a plurality of layers. For example, the blocking insulating layer BI may include an aluminum oxide layer and a silicon oxide layer. A stacking order of the aluminum oxide layer and the silicon oxide layer may be changed.

The information storing element ISE is formed with a thickness thinner than half of the thickness of the recessed region 210 so as to ensure a space for the conductive pattern CP. The information storing element ISE may be formed by a deposition technique (for example, chemical vapor deposition or atomic layer deposition) capable of providing excellent property of step coverage. Therefore, the information storing element ISE may be formed to conformally cover a resultant structure with the recessed region 210. Meanwhile, when the semiconductor pattern 180a included in the active pattern 180 is formed of silicon, the tunnel insulating layer TN may be, for example, a silicon oxide layer formed by subjecting the semiconductor pattern 180a to thermal oxidation. When the thermal oxidation is performed, the information storing element ISE may have different thicknesses in the sidewall of the active pattern 180 and in the sidewall of the sidewall molds 145. For example, the tunnel insulating layer TN may not be formed in the sidewall of the sidewall mold 145 or may be formed with a thickness thinner than that in the sidewall of the active pattern 180, as illustrated in FIG. 8.

The conductive layer may be formed to fill the recessed region 210 and the trench 200 that are covered with the information storing element ISE. The conductive layer may contain, for example, at least one of doped silicon, tungsten, metal nitride layers, and metal silicides. Meanwhile, since the technical spirit of the inventive concept is not limited to the Flash memory device, the information storing element ISE and the conductive layer may be modified in various forms in its material and its structure.

The removing of the conductive layer in the trench 200 may include, for example, performing anisotropic etching on the conductive layer by using the capping layer 190 as an etching mask. When the conductive layer is removed in the trench 200, the conductive layer forms the conductive patterns CP separated vertically from each other. That is, the conductive patterns CP are partially formed in the recessed regions 210 and are used as electrodes that change information stored in the information storing element ISE. According to other embodiments of the present invention, the conductive layer may be formed to fill partially the trench 200 and then it may be removed from the trenches 200 by isotropic etching way.

The bit lines BL are formed to electrically connect the lower active patterns 180, where major axes of the bit lines BL are arranged along a direction intersecting the major axes of the gate patterns GP. To connect the bit line BL electrically to the active patterns 180, bit line plugs BL_P may further be arranged therebetween, as illustrated in FIG. 5.

[Three-dimensional NAND Flash Memory Device]

FIG. 9 is a perspective view illustrating a three-dimensional semiconductor memory device according to a modified example of the inventive concept. For example, FIG. 9 is the perspective view illustrating a three-dimensional NAND Flash memory device realized according to the technical spirit of the inventive concept. For convenience in description, the duplicated technical features described with reference to FIGS. 1 through 8 may be omitted below.

As a modification of fabricating method described with reference to FIG. 3, after forming the trenches 200, an impurity region is formed in the substrate 100. According to an embodiment of the inventive concept, the impurity region may be formed by an ion implanting by using the preliminary mold structure PMS as an ion implanting mask. In this case, as illustrated in FIG. 9, interconnections CSL may be formed in the substrate 100 between the mold structures MS to be used to transfer electric signals to the active regions.

The interconnection CSL may be used as a common source that connects the active patterns 180 to each other. In the meantime, according to an embodiment of the inventive concept, the interconnection CSL is distant from a region of the substrate 100 disposed below the sidewall molds 145. According to an embodiment of the inventive concept, an insulating pattern (not illustrated) for isolation between electronic elements may further be formed in the substrate 100 below the sidewall molds 145.

According to the embodiment of the three-dimensional NAND Flash memory, as illustrated in FIG. 6, the conductive patterns CP may include at least one lower select line LSL adjacent to the substrate 100, at least one upper select line USL adjacent to the bit line BL, and a plurality of word lines WL0 to WL7 interposed between the upper select line USL and the lower select line LSL. The lower select line LSL may be used as a gate electrode of a ground select transistor controlling electric connection between the interconnection CSL and the active pattern 180. The upper select line USL may be used as a gate electrode of a string select transistor controlling electric connection between the bit line BL and the active patterns 180.

The embodiments in which the layer number of the gate patterns GP is ten have been described. However, the above disclosure is provided to exemplify the inventive concept, and the layer number of gate patterns GP or the number of the sidewall molds 130 may be modified. According to a modified example of the inventive concept, the gate patterns GP or the active patterns 180 may be formed by a method of repeatedly applying the method described with reference to FIGS. 1 through 5 or a modified method thereof. For example, U.S. patent application Ser. No. 12/612,125 and Korean Patent Application No. 2009-0087063, the disclosures of which are each incorporated by reference herein in their entireties, may be applied without modification or with modification to realize the technical spirit of the inventive concept.

[Second Embodiment]

Figure 14A:
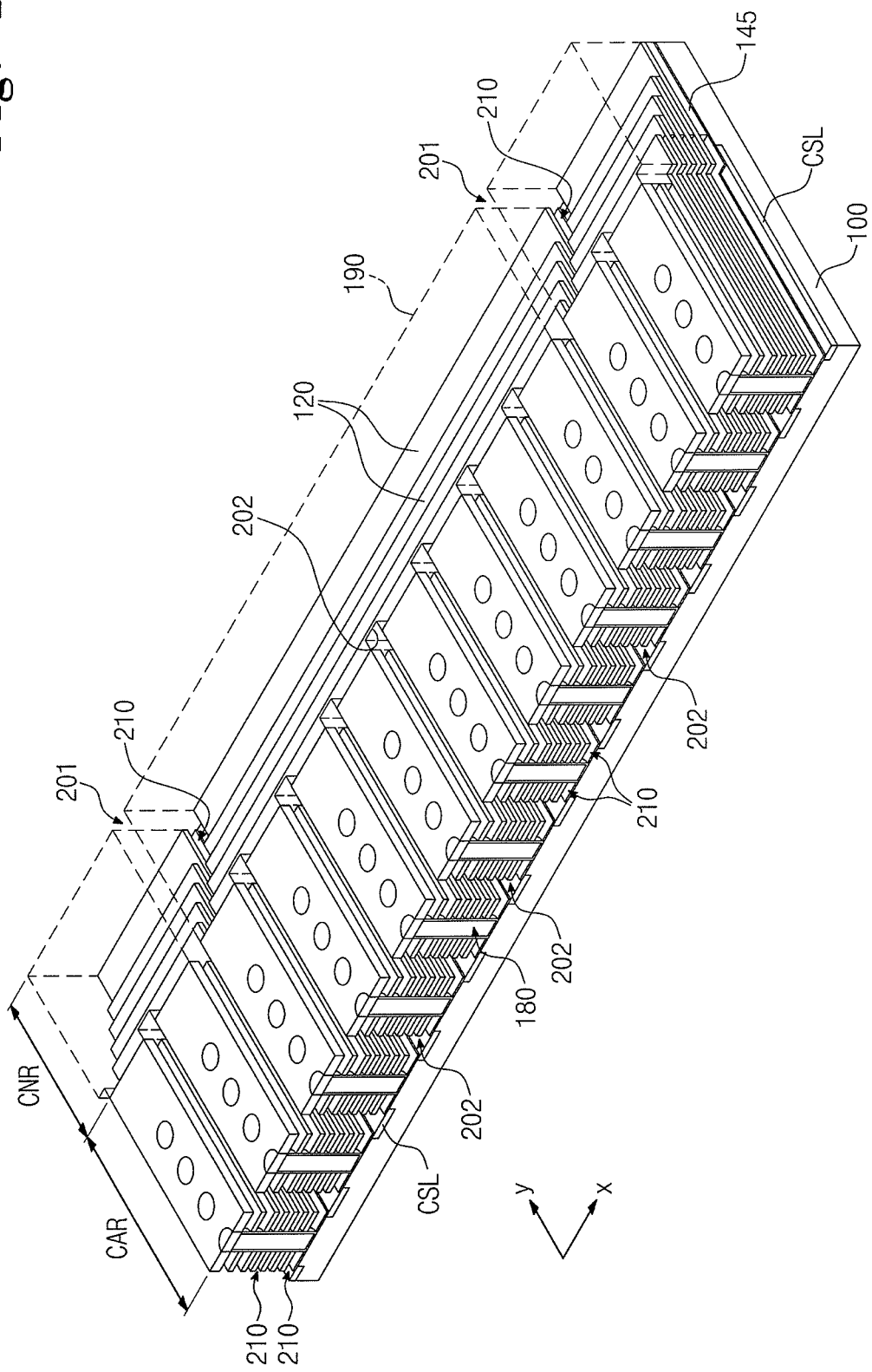
Figure 14B:
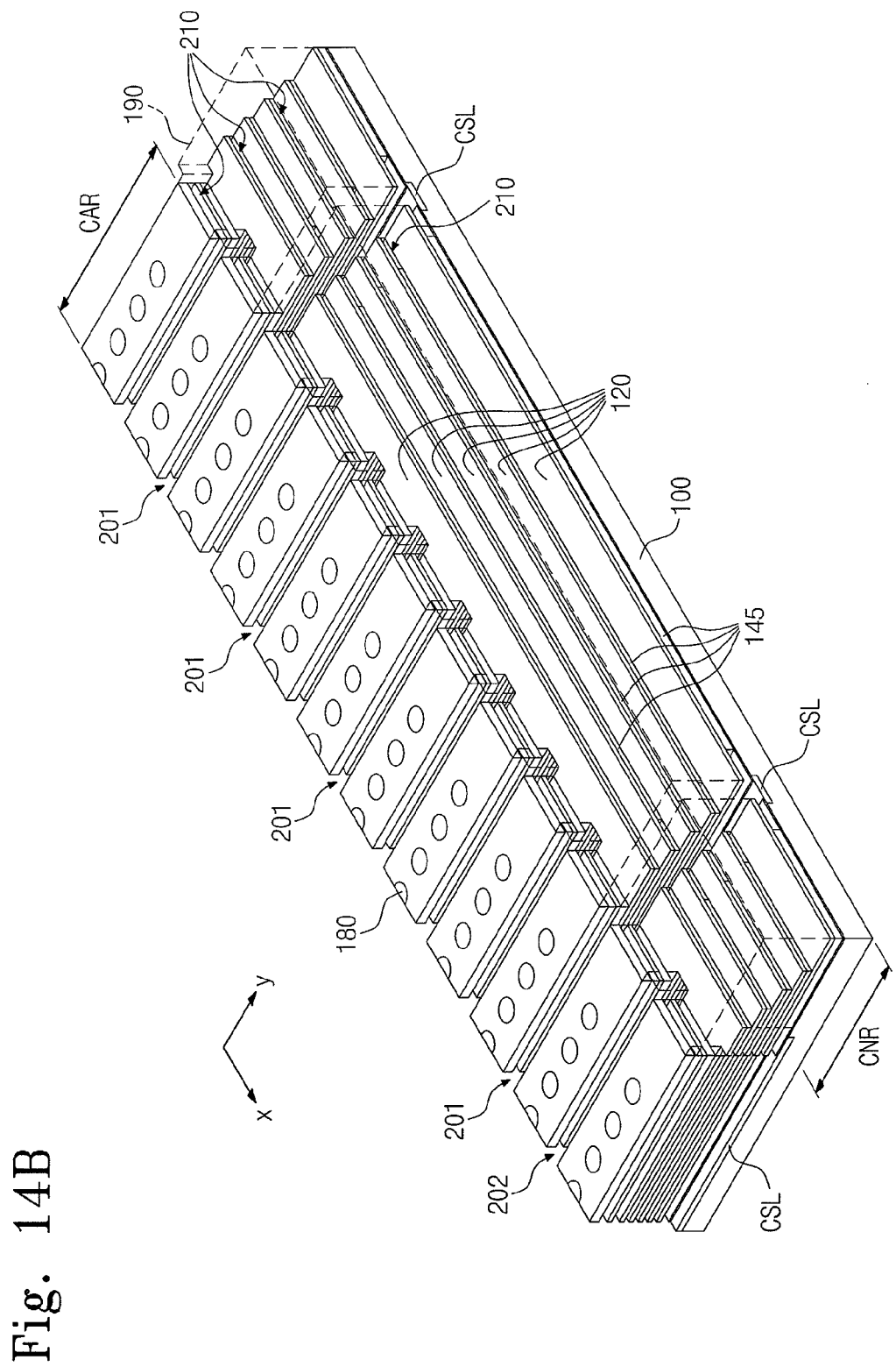
Figure 14C:
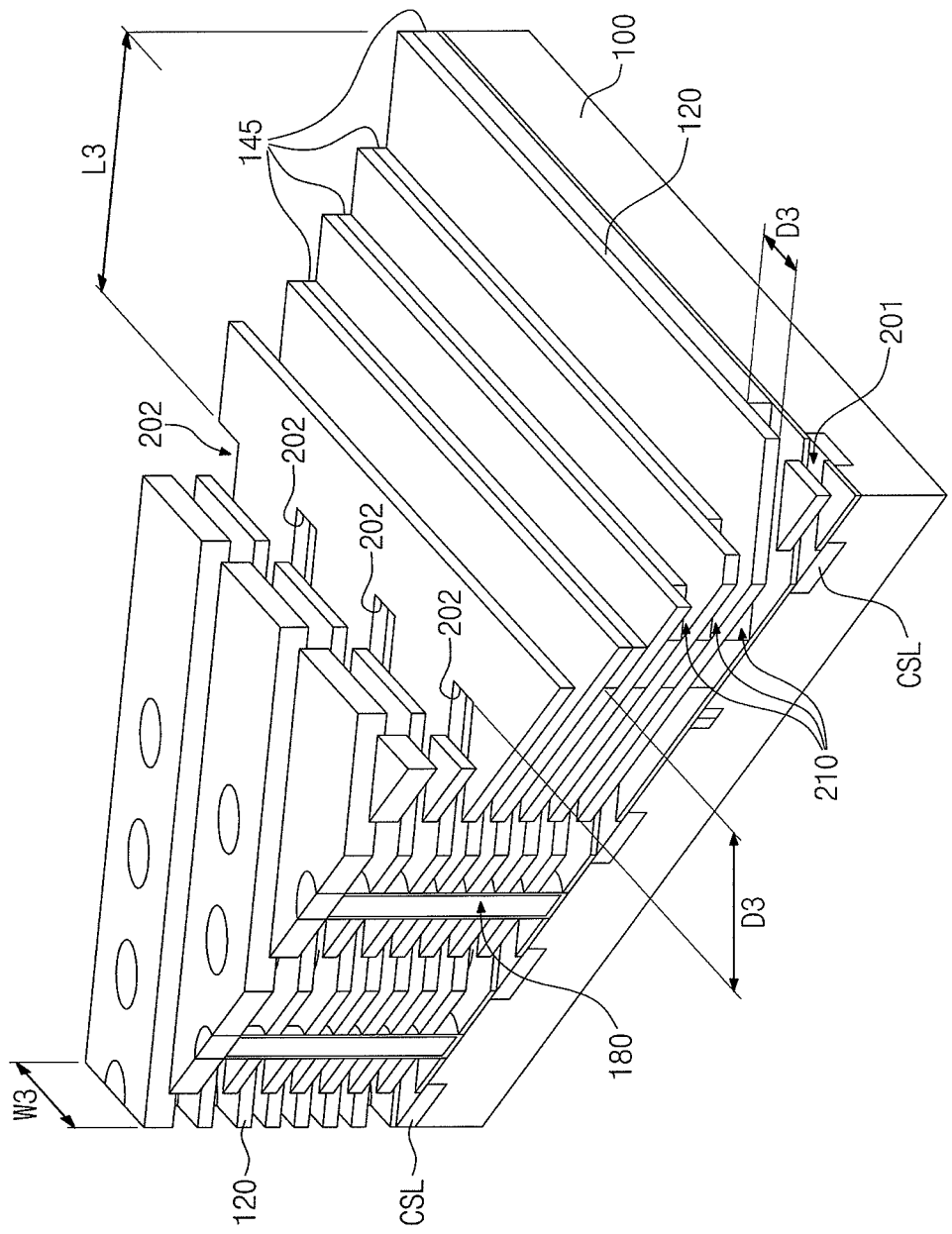
Figure 14D:
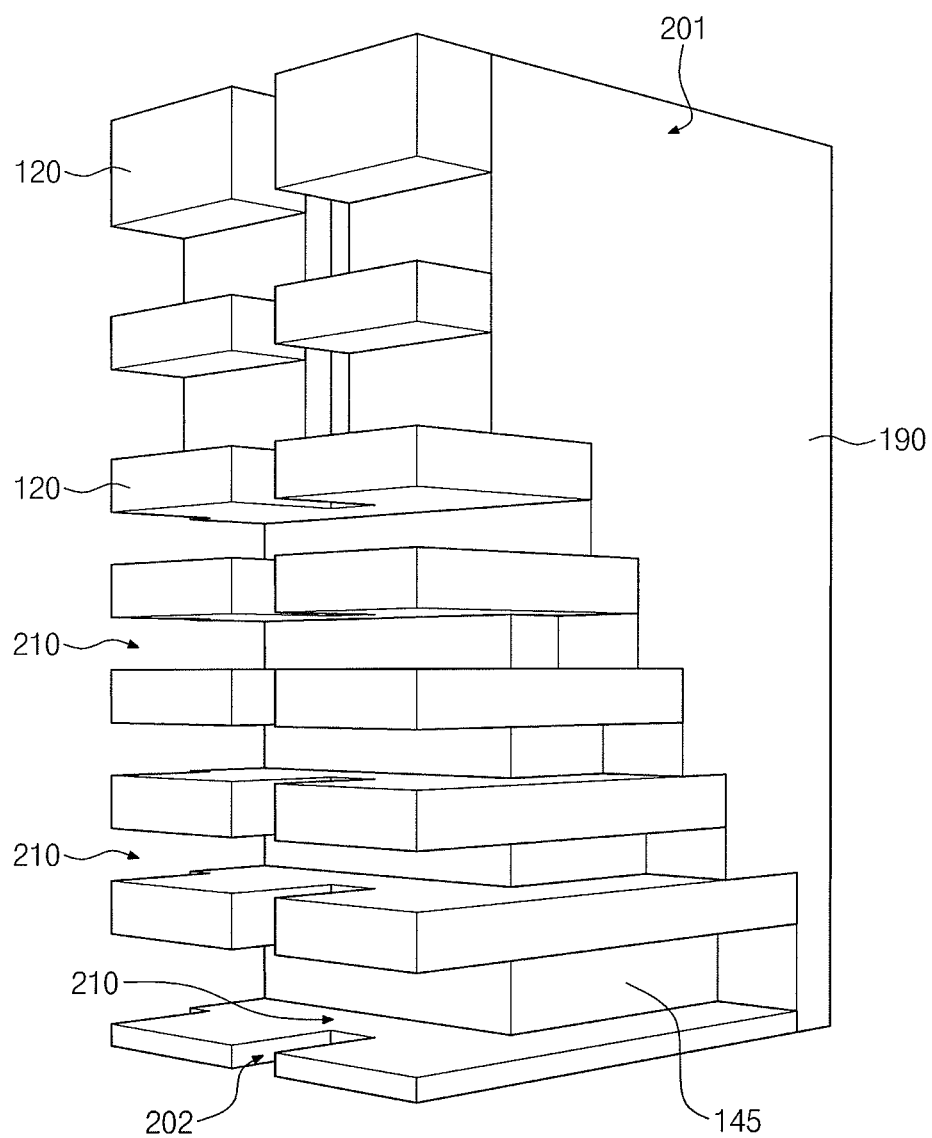
Figure 15A:
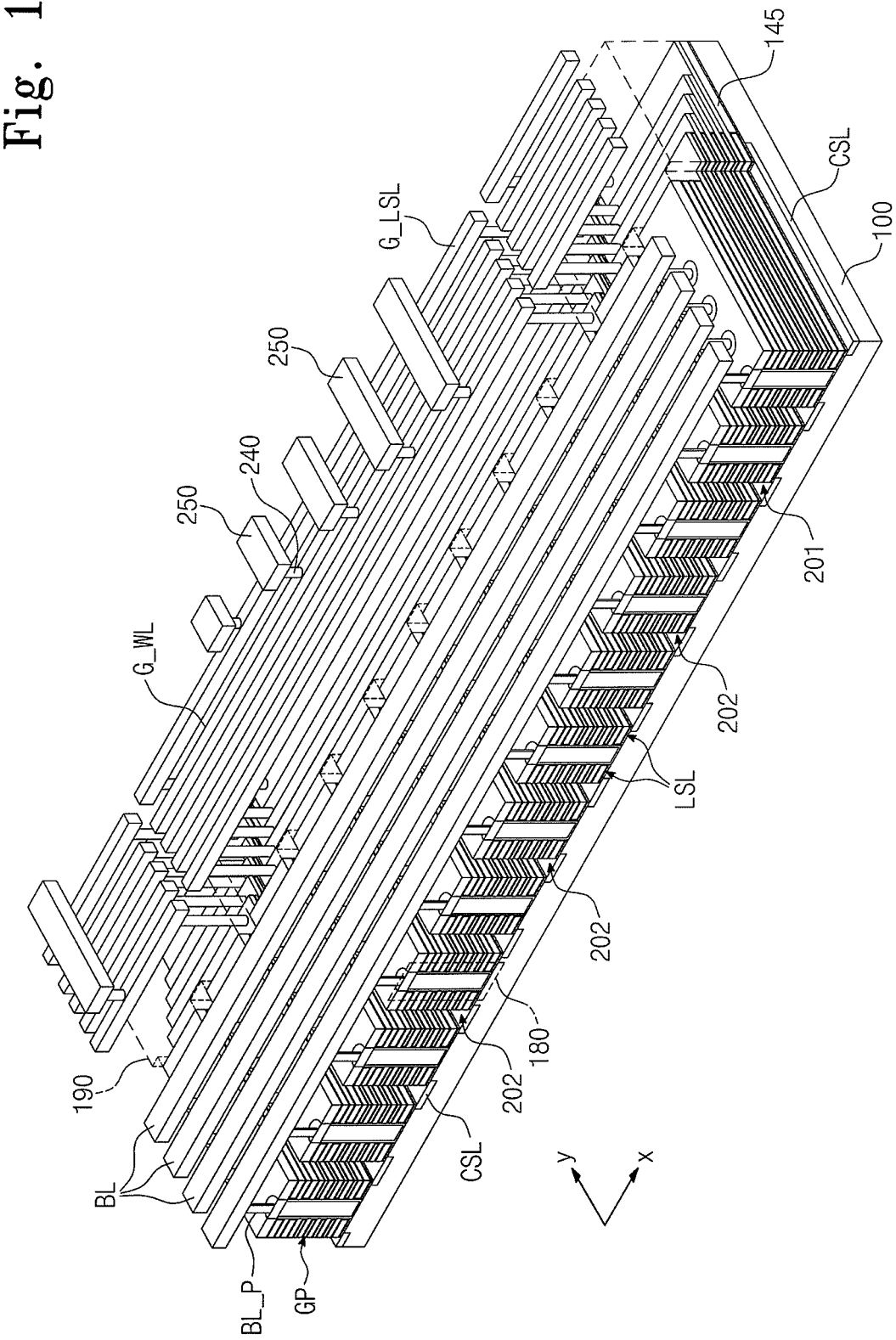
Figure 15B:
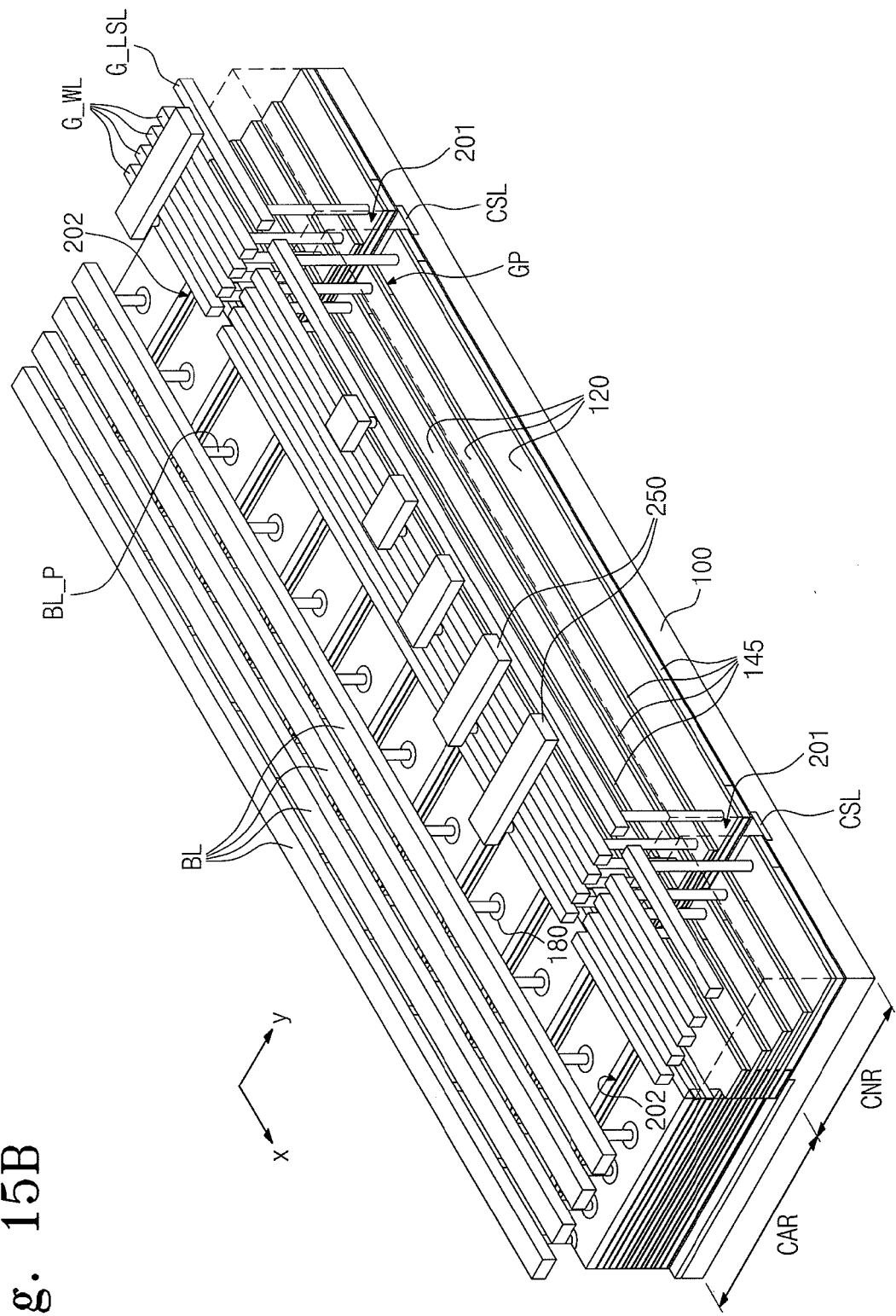
Figure 15C:
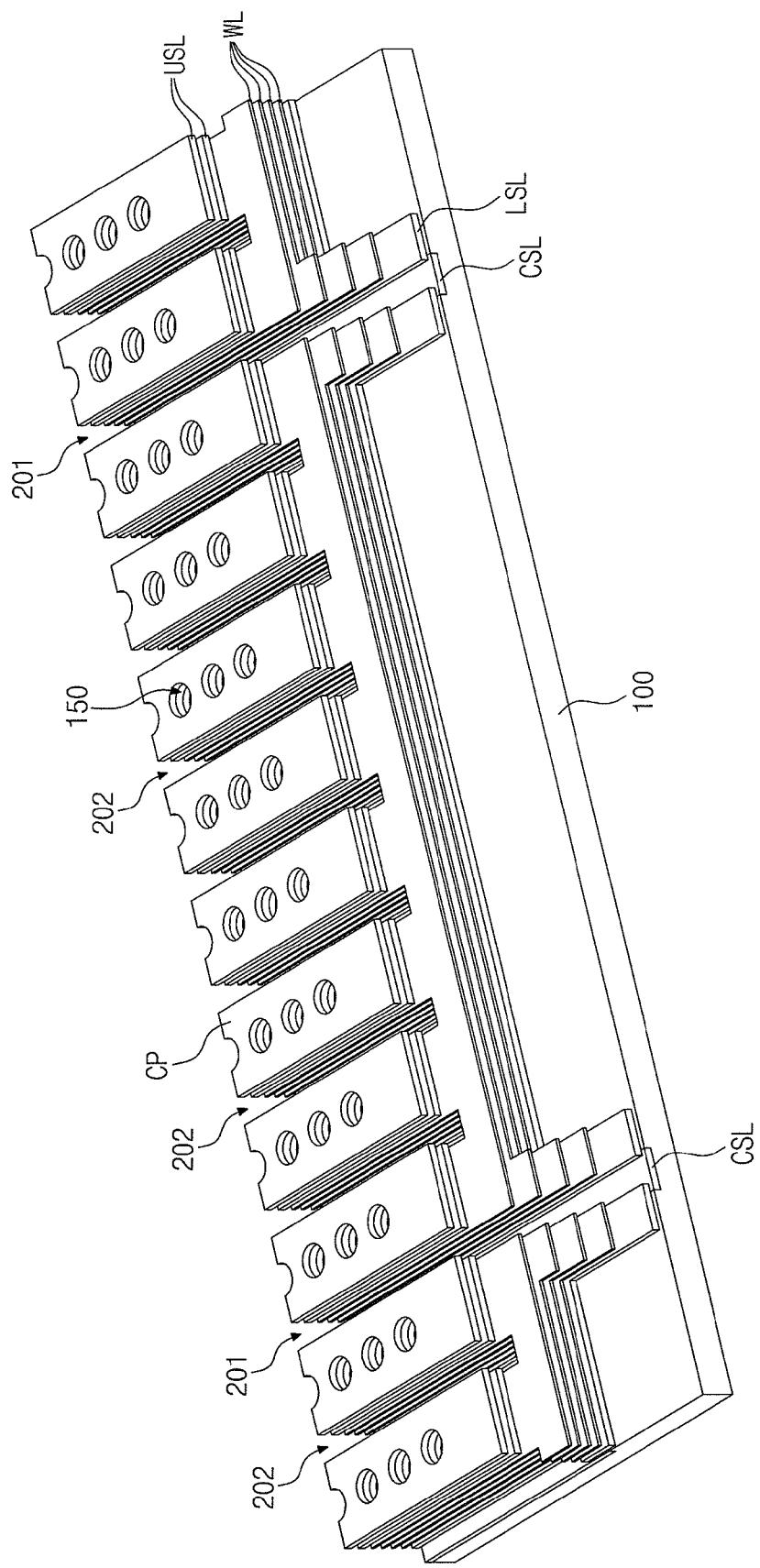
Figure 15D:
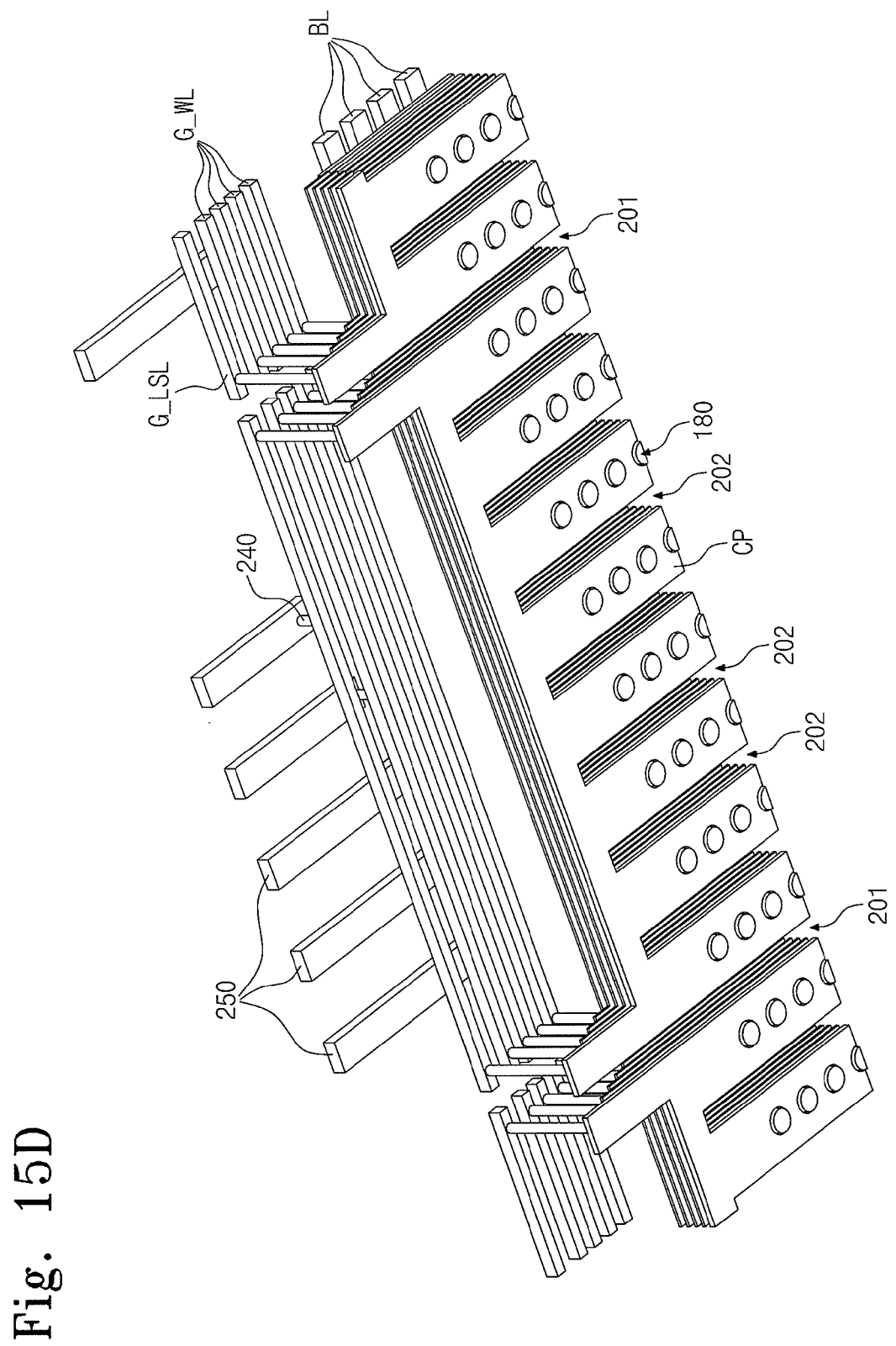

FIGS. 10 through 12, FIG. 13A, FIG. 14A, and FIG. 15A are perspective views illustrating a method of fabricating a three-dimensional semiconductor device according to a second embodiment of the inventive concept. FIG. 13B, FIGS. 14B through 14D, and FIGS. 15B through 15D are perspective views provided to understand the technical spirit of the inventive concept. Specifically, FIGS. 10 through 12 and FIGS. 13A through 15A are perspective views illustrating a method of fabricating the semiconductor device according to the embodiment in a predetermined first view. FIGS. 13B through 15B are perspective views illustrating the semiconductor device illustrated in FIG. 13A, FIG. 14A, and FIG. 15A in a second view different from the first view. FIGS. 14C and 14D are perspective views for explaining the technical features described in FIG. 14A in more detail. FIGS. 15C and 15D are perspective views for explaining the technical features described in FIG. 15A in more detail. For convenience in description, the duplicated technical features described with reference to FIGS. 1 through 9 may be omitted below.

Figure 10:
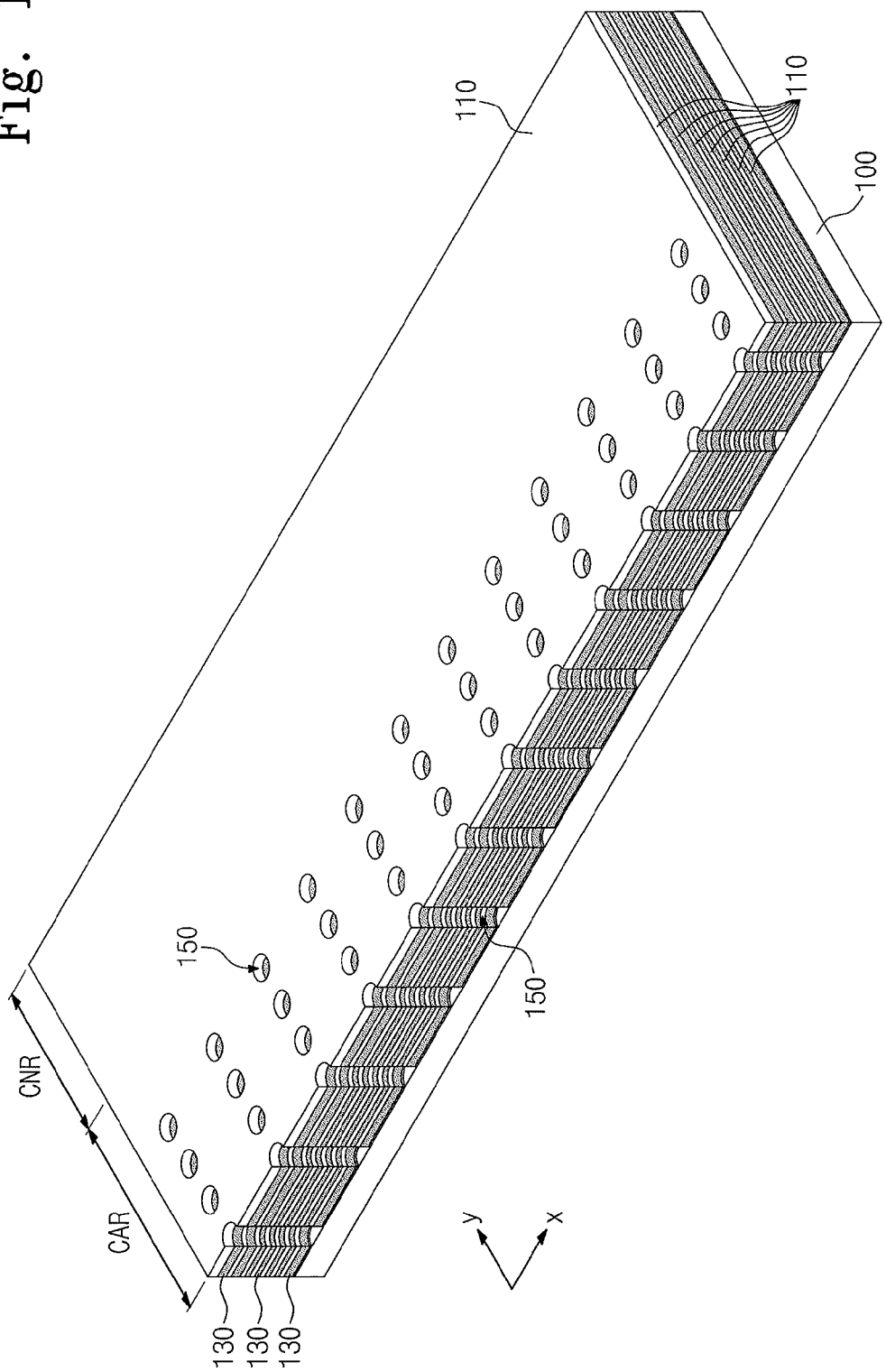
Figure 11:
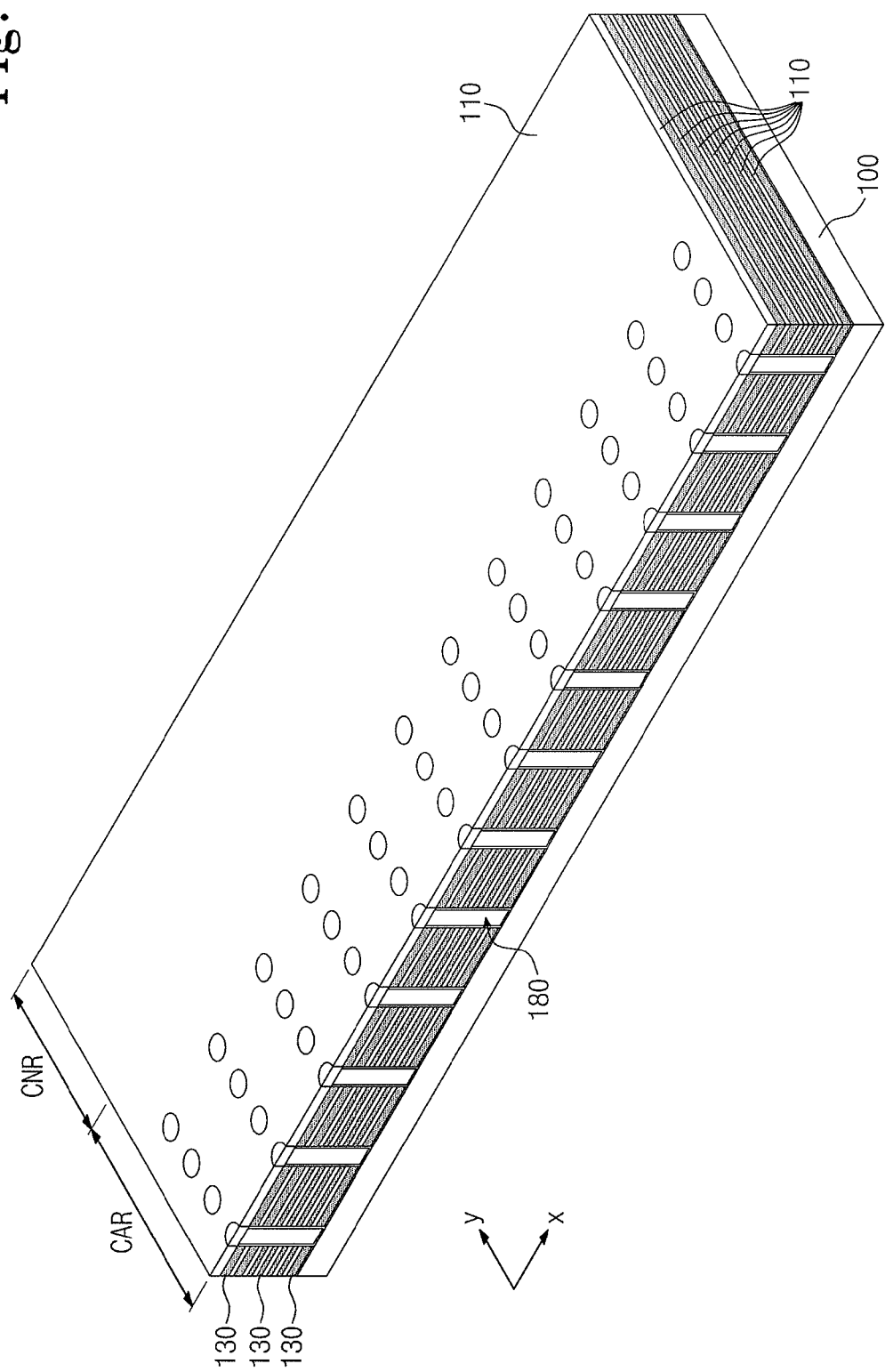

Referring to FIGS. 10 and 11, the interlayer mold layers 110 and the sidewall mold layers 130 are sequentially and alternately stacked on the substrate 100 and are patterned to form active openings 150 exposing the upper surface of the substrate 100, and then to foam active patterns 180 filling the active openings 150.

The interlayer mold layers 110, the sidewall mold layers 130, the active openings 150, and the active patterns 180 may be formed by the fabricating method described with reference to FIGS. 1 and 2. That is, the sidewall mold layers 130 may be formed of a material having an etch selectivity to the interlayer mold layers 110. As illustrated in FIG. 6, each of the active patterns 180 may include a semiconductor pattern 180a covering conformally the inner wall of the active opening 150 and a buried insulating pattern 180b filling the active opening 150 in which the semiconductor pattern 180a is formed. Additionally, each active pattern 180 may further include a junction pattern 180c disposed above the semiconductor pattern 180a.

According to the present embodiment, the substrate 100 may include a cell array region CAR, where memory cells are disposed, and a connection region CNR located near the cell array region CAR. The active pattern 180 may be locally in the cell array region CAR and may not be formed in the connection region CNR. According to a modified example of the inventive concept, however, dummy active patterns (not illustrated) that are not used as memory cells may further be disposed in the connection region CNR.

According to an aspect of the technical spirit of the inventive concept, the cell array region CAR may be defined as a region where the active patterns forming the memory cells are disposed. Accordingly, the boundary between the cell array region CAR and the connection region CNR may be determined variously by ways of disposing the active patterns 180.

Referring to FIG. 12, the interlayer mold layers 110 and the sidewall mold layers 130 are patterned so that the interlayer mold layers 110 and the sidewall mold layers 130 in the connection region CNR are formed in the shape of a terraced structure. The terraced structure may be formed by a trimming process of forming a predetermined sacrificial mask to cover the cell array region and the connection region and then reducing the occupied area of the sacrificial mask. For example, Korean Patent Application No. 2009-0099370, the disclosure of which is incorporated by reference herein in its entirety, discloses a method of forming the terraced structure by a trimming process which may be applied without modification or with modification to realize the technical spirit of the inventive concept.

Subsequently, a capping layer 190 is formed on the resultant product of the terraced structure. The capping layer 190 may be formed locally in the connection region CNR, but may extend to the cell array region CAR to cover the active patterns 180.

Figure 13A:
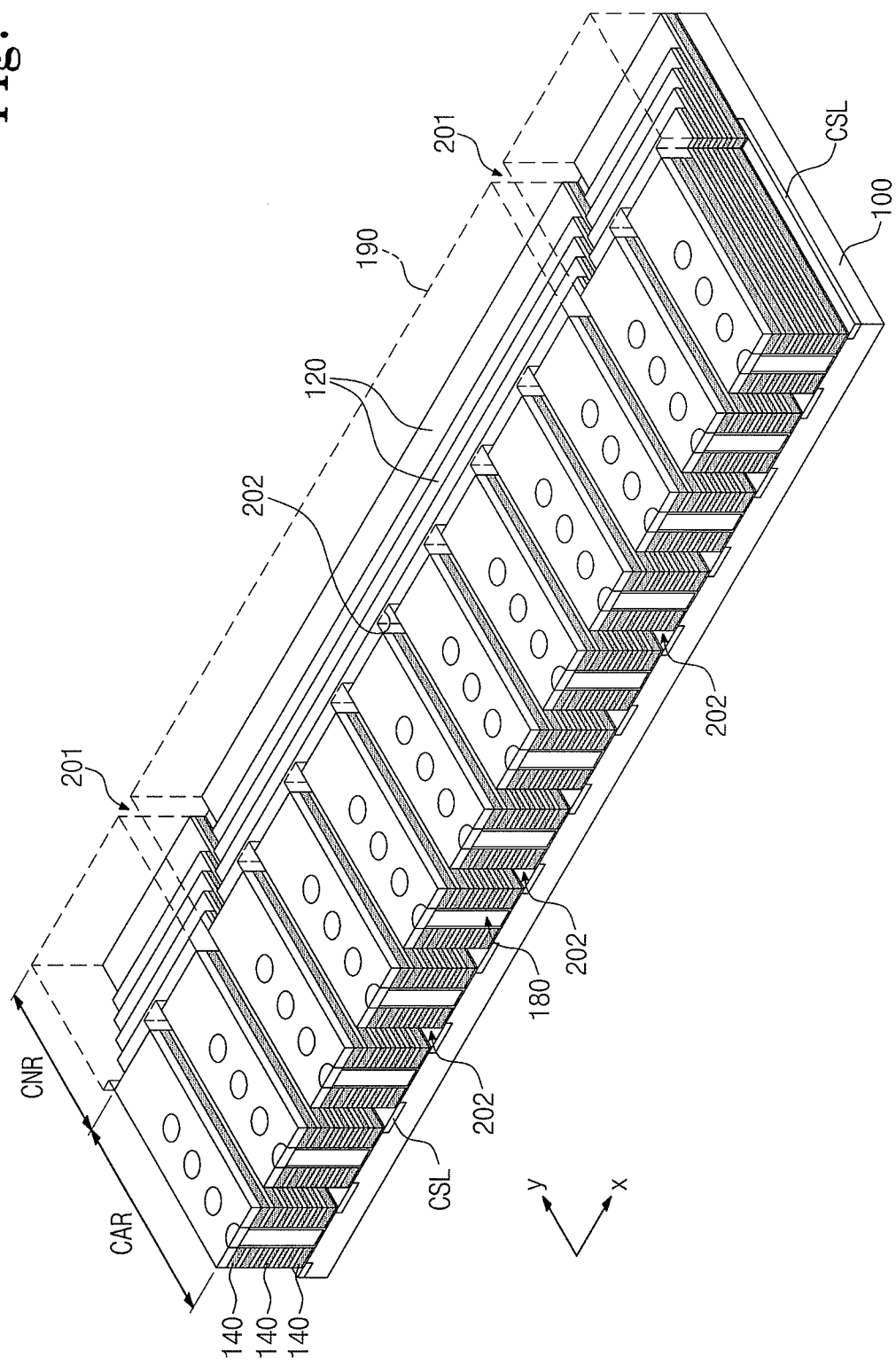
Figure 13B:
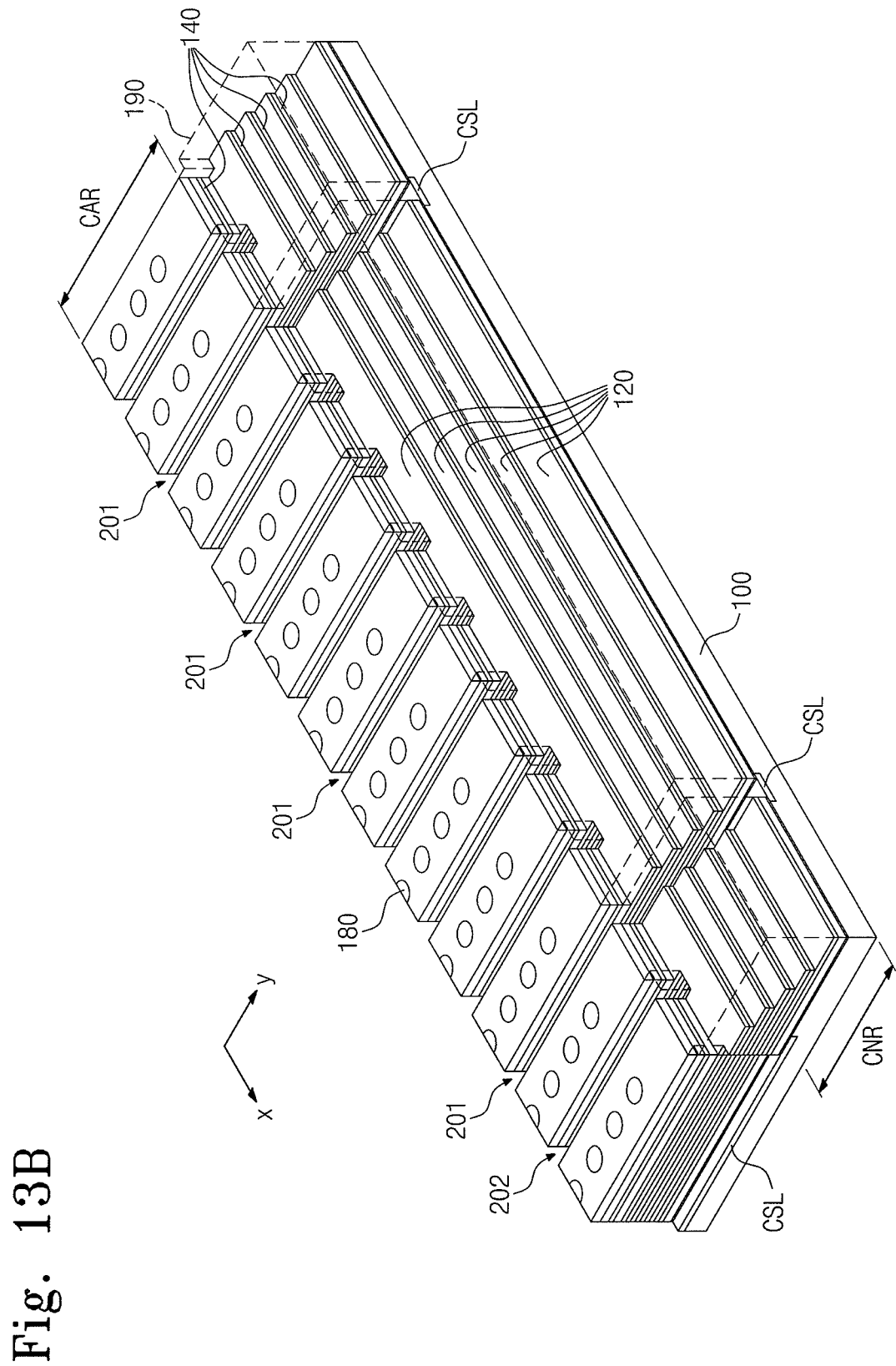
FIG. 13B, FIGS. 14B through 14D, and FIGS. 15B through 15D are perspective views provided to understand the technical spirit of the inventive concept.

Referring to FIGS. 13A and 13B, the interlayer mold layers 110 and the sidewall mold layers 130 are patterned to form a preliminary mold structure that includes interlayer molds 120 and preliminary sidewall molds 140 sequentially and alternately stacked.

The forming of the preliminary mold structure may include forming trenches 201 and 202 to expose the upper surface of the substrate 100 by substantially perforating the interlayer mold layers 110 and the sidewall mold layers 130. Then, the sidewalls of the interlayer molds 120 and the preliminary sidewall molds 140 are exposed by the trenches 201 and 202. The trenches 201 and 202 may be formed in the forming of the trench 200 described with reference to FIG. 3 according to the embodiment of the inventive concept.

According to the embodiment of the inventive concept, the trenches 201 and 202 may include first trenches 201, which intersect the cell array region CAR, and the connection region CNR and a plurality of second trenches 202, which intersect the cell array region CAR but do not intersect the connection region CNR. That is, the first trenches 201 may be longer than the second trenches 202. The preliminary mold structure may include a plurality of partial preliminary mold structures isolated by the first trenches 201.

Due to the difference in the length between the trenches 201 and 202, the sidewalls of the interlayer molds 120 and the preliminary sidewall molds 140 are exposed by the first trenches 201 in the connection region CNR and are exposed by both the first trenches 201 and the second trenches 202 in the cell array region CAR. In other words, the first trenches 201 may be openings defining the outer sidewalls of each of the partial preliminary mold structures and the second trenches 202 may be openings defining the inner sidewalls of each of the partial preliminary mold structures.

According to a modified example of the inventive concept, the second trenches 202 may partially extend toward the inside of the connection region CNR beyond the cell array region CAR. In this case, the sidewalls of the interlayer molds 120 and the preliminary sidewall molds 140 may partially be exposed by the second trenches 202 in the connection region CNR. However, the second trenches 202 may still be formed as openings formed inside the partial preliminary mold structure.

According to an embodiment of the inventive concept, unlike the first embodiment described with reference to FIGS. 1 through 12, one of the first trenches 201 and the second trenches 202 may be formed on both sides of the active patterns 180 (or the active structures). According to a third embodiment of the inventive concept, however, as described with reference to FIG. 16A, the first trenches 201 and the second trenches 202 may be formed in the cell array region CAR so as to have substantially the same configuration as that of the trenches 200 described in the above-described first embodiment. That is, two active structures AS or one active group AG may be disposed between two adjacent trenches of the first trenches 201 and the second trenches 202. Here, the meaning of the "active structure AS" and the "active group AG" is the same as the meaning described with reference FIG. 2.

As illustrated in FIGS. 13A and 13B, at least one second trench 202 may be disposed between two adjacent trenches of the first trenches 201. That is, at least one second trench 202 may be formed in each of the partial preliminary mold structures. According to an embodiment of the inventive concept, the number of the trenches 202 formed in each partial preliminary mold structure may be in the range from, for example, two to sixty three.

According to an embodiment of the inventive concept, after the first trenches 201 and the second trenches 202 are formed, impurity regions used as interconnections or the common source line CSL may further be formed on the substrate 100. As described with reference to FIG. 9, the impurity regions may be formed by the ion implanting performed by using the preliminary mold structure as an ion implanting mask.

Referring to FIGS. 14A through 14D, the sidewalls of the preliminary sidewall molds 140 exposed by the first trenches 201 and the second trenches 202 are etched selectively and horizontally. Then, the sidewalls 145 defining the recessed regions 210 are formed together with the interlayer molds 120. The sidewall molds 145 and the interlayer molds 120 form a mold structure. As in the above-described first embodiment, the recessed regions 210 may be gap regions extending horizontally from the trench 200 to a space between the interlayer molds 120 and exposing the active patterns 180 and the sidewall molds 145. The recessed regions 210 and the sidewall molds 145 may be formed by the fabricating method described with reference to FIGS. 4 and 9 according to the embodiments of the inventive concept.

According to this embodiment of the inventive concept, as illustrated in FIG. 14C, an etching depth D3 (that is, a distance between the sidewalls of the sidewall molds 145 and the trenches 201 and 202 adjacent to the sidewalls) in the horizontal etching may be smaller than the half of the width of the connection region CNR or a length L3. That is, a relation of D3<L3/2 is satisfied. With such a configuration, the sidewall molds 145 may not be removed completely and may remain in the connection region CNR. The sidewalls molds 145 remaining in the connection region CNR may be used not only as molds defining the recessed region 210 but also as supporting elements preventing a difficulty in which the distances between the interlayer molds 120 are changed during the horizontal etching.

The etching depth D3 may be larger than a distance W3 between the trenches 201 and 202. That is, a relation of D3>W3/2 is satisfied. In this case, the sidewall molds 145 may be removed around the active patterns 180, and therefore the recessed region 210 completely exposes the sidewalls of the active patterns 180 between the interlayer molds 120, as illustrated in FIG. 14C.

As described above, the preliminary sidewall molds 140 are horizontally etched not only around the first trenches 201 but also around the second trenches 202. Then, the recessed region 210 may also be formed in a region adjacent to the end of the second trench 202 (hereinafter, referred to as a region for connecting electrodes), as illustrated in FIG. 14D. According to an aspect of the technical spirit of the inventive concept, the recessed regions around the active patterns 180 (hereinafter, referred to as electrode regions) may be connected to each other by the region for connecting electrodes. The related technical matters will be described in more detail with reference to FIG. 17.

As described with reference to FIG. 12, the sidewall mold layers 130 are patterned so as to have the terraced structure in the connection region CNR. Therefore, the preliminary sidewall molds 140 are also formed so as to have the terraced structure in the connection region CNR. Moreover, since the recessed regions 210 are formed as the product formed by etching the preliminary sidewall molds 140 horizontally, as illustrated in FIG. 14D, the recessed regions 210 adjacent to the first trench 201 of the connection region CNR are also formed so as to have the terraced structure.

Referring to FIGS. 15A through 15D, after the gate patterns GP are formed to fill the recessed regions 210, a global interconnection structure is formed which is connected to the bit lines BL and the gate patterns GP connected to the active patterns 180.

The gate patterns GP and the bit lines BL may be formed in the same way as that described with reference to FIGS. 5 and 6. That is, the gate pattern GP may include the information storing element ISE and the conductive pattern CP sequentially filling the recessed region 210, as described with reference to FIGS. 6 through 8. The bit lines BL may be arranged along a direction (that is, an x direction) intersecting the major axis of the gate patterns GP. Moreover, to connect the bit line BL electrically to the active patterns 180, bit line plugs BL_P may further be disposed between the bit line BL and the active patterns 180.

According to an embodiment of the inventive concept, the global interconnection structure may be formed simultaneously with the bit lines BL and formed of the same material as that of the bit lines BL when the bit lines BL are formed. According to a modified example, however, the global interconnection structure and the bit line BL may be formed independently.

The global interconnection structure may include a plurality of conductive lines arranged on the connection region CNR. For example, according to an embodiment of a three-dimensional NAND Flash memory, as illustrated in FIGS. 15A, 15B and 15D, the global interconnection structure may include at least one global lower select line G_LSL, at least one upper global select line (not illustrated), and a plurality of global word lines G_WL. The global lower select line G_LSL and the global word lines G_WL may be disposed in parallel to the bit lines BL and may be connected to predetermined upper interconnection structures 240 and 250.

According to an embodiment of the inventive concept, the global lower select line G_LSL and each of the global word lines G_WL may be formed to be connected to each of the gate patterns GP horizontally isolated by the first trenches 210. That is, the global lower select line G_LSL and each of the global word lines G_WL may be disposed in the connection region CNR so as to have a length shorter than that of the bit line BL. One global lower select line G_LSL and one global word line G_WL may electrically be connected to one gate pattern GP.

As described above, the recessed regions 210 adjacent to the first trenches 201 of the connection region CNR are also formed so as to have the terraced structure. Therefore, the gate pattern GP or the conductive pattern CP formed by the molds of the recessed regions may also be formed so as to have the terraced structure. For example, as illustrated in FIGS. 15C and 15D, the conductive patterns CP are formed so as to have the terraced structure in a region adjacent to the first trench 201. Some aspects of the technical spirit of the inventive concept will be described in more detail below with reference to FIGS. 17 and 18.

[Third Embodiment]

Figure 16A:
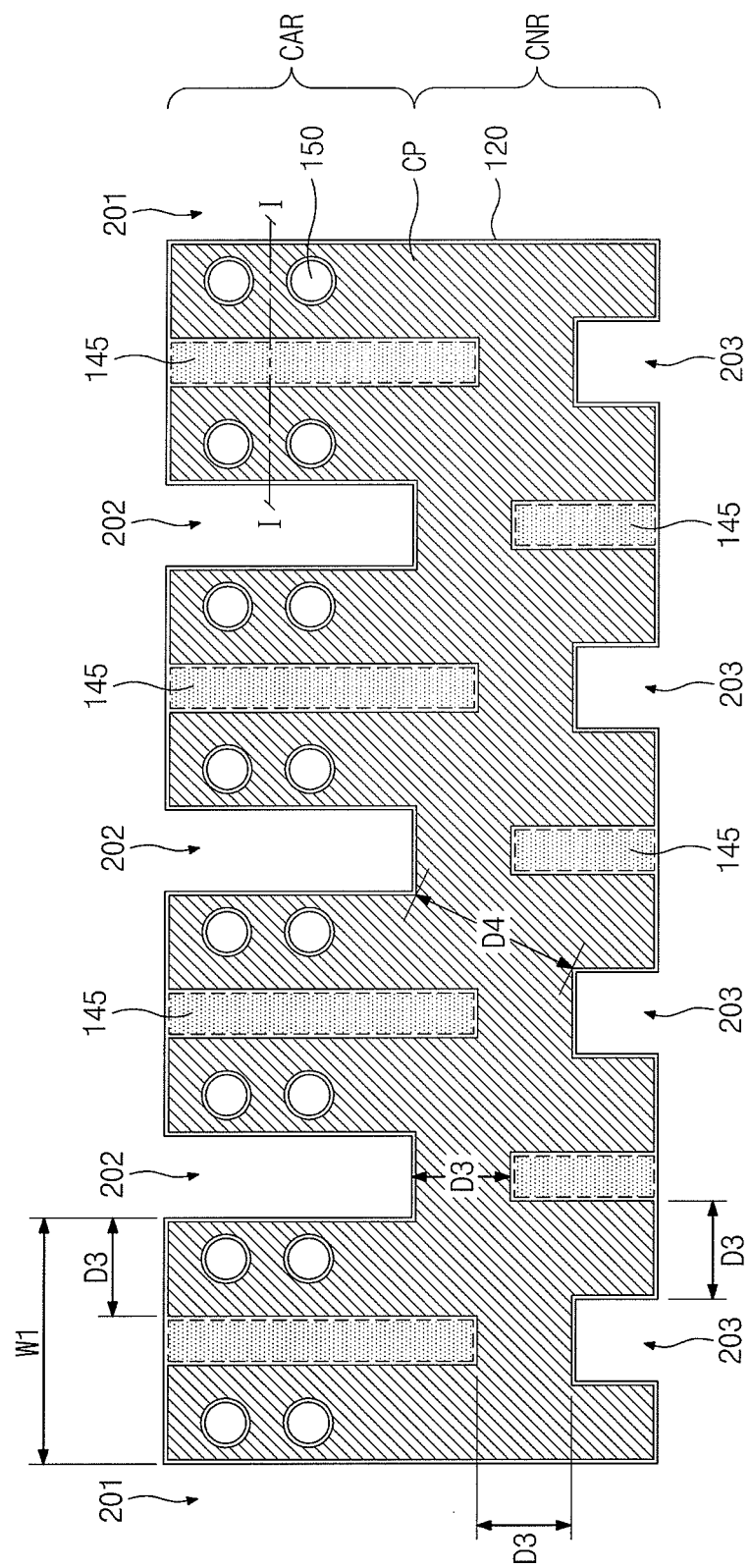
FIGS. 16A and 16B are a plan view and a perspective view illustrating a three-dimensional semiconductor memory device according to a third embodiment of the inventive concept, respectively.
Figure 16B:
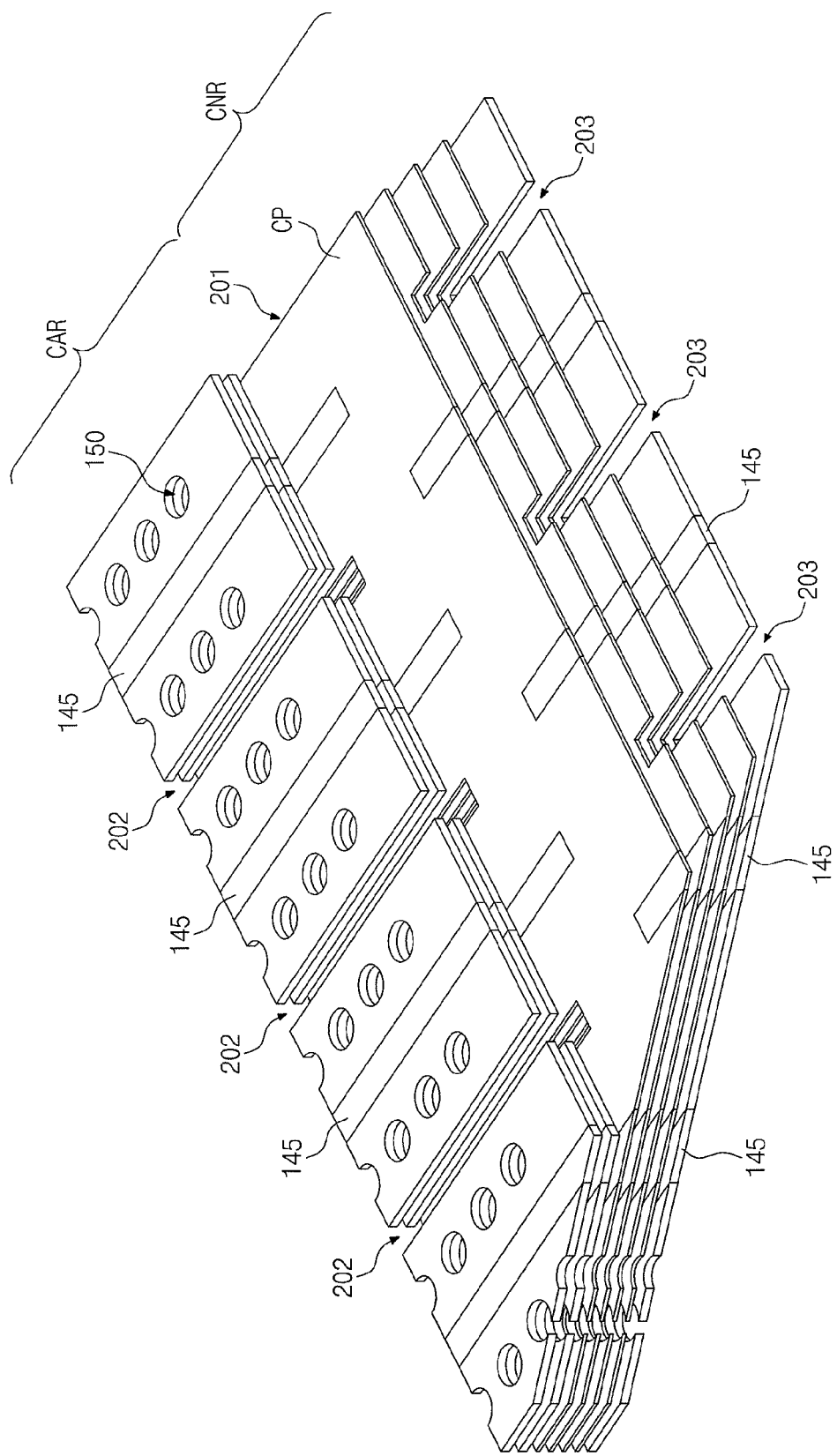
Figure 16C:
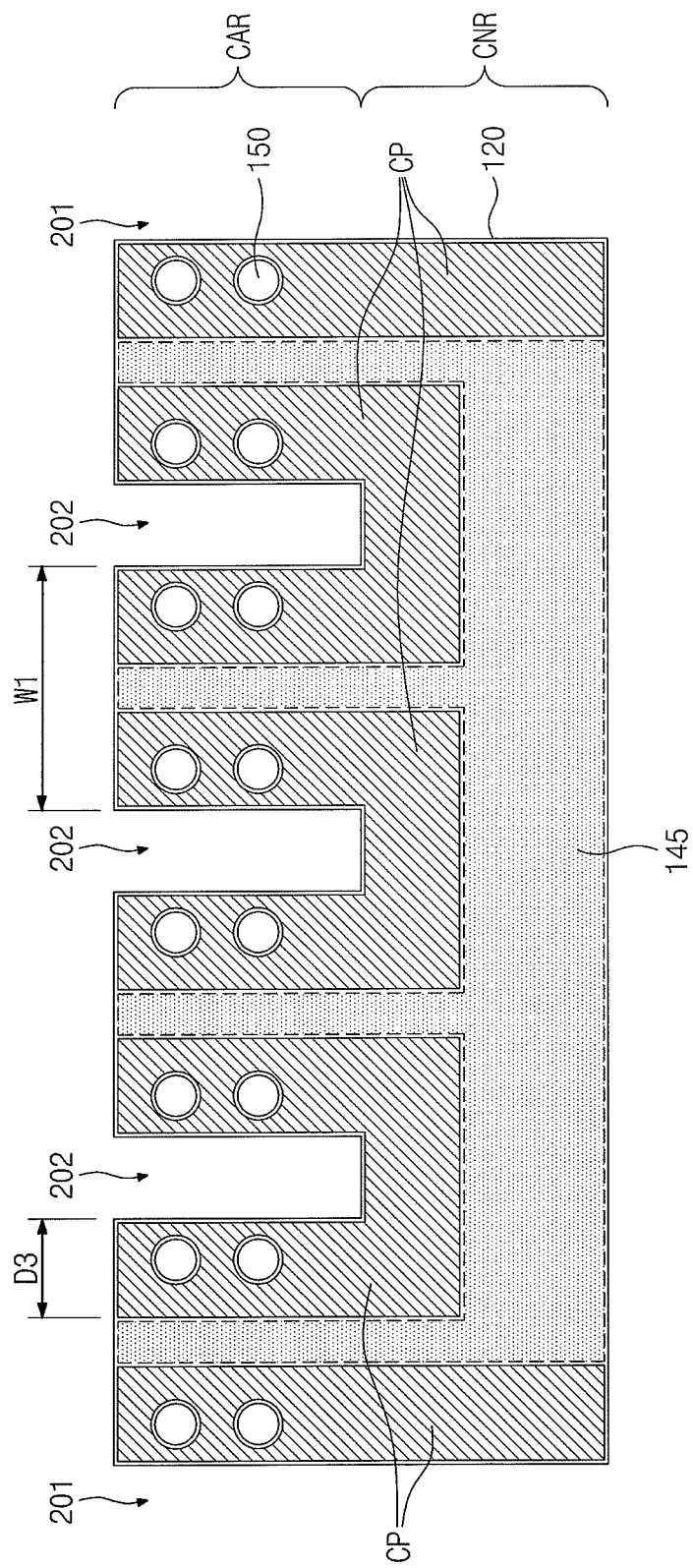
FIG. 16C is a plan view illustrating a three-dimensional semiconductor memory device in comparison to the three-dimensional semiconductor memory device according to the three embodiments of the inventive concept.

FIGS. 16A and 16B are a plan view and a perspective view illustrating a three-dimensional semiconductor device according to a third embodiment of the inventive concept, respectively. FIG. 16C is a plan view illustrating a three-dimensional semiconductor device in comparison to the three-dimensional semiconductor device according to the three embodiment of the inventive concept. Since most of the elements were discussed with respect to the previous embodiments, certain details may be omitted for the sake of brevity.

Referring to FIGS. 16A and 16B, the three-dimensional semiconductor device according to this embodiment of the inventive concept may further include third trenches 203 formed in the connection region CNR. According to an embodiment of the inventive concept, the third trenches 203 may be formed together with the first trenches 201 and the second trenches 202. According to another embodiment of the inventive concept, however, the third trenches may be formed independently from the first second trenches. For example, the third trenches 203 may be formed in the patterning of the terraced structure.

Referring to FIG. 16C, the three-dimensional semiconductor device according to a comparative example of the inventive concept may include the cell array region CAR, which has the structural features of the first embodiment described with reference to FIGS. 1 through 9, and the connection region CNR, which has the structural features of the second embodiment described above. According to the first embodiment of the inventive concept, the sidewall molds 145 are disposed between the active openings 150. Therefore, the width of the recessed region 210 and the etching depth D3 in the horizontal etching have to be smaller than the width W1 between the two adjacent trenches of the second trenches 202. However, the recessed regions 210 and the conductive patterns CP formed around the second trenches 202 are isolated from each other by the sidewall molds 145.

Alternatively, as illustrated in FIGS. 16A and 16B, the recessed regions and the conductive patterns CP formed around the third trenches 203 and the second trenches 202 may be connected to each other upon forming the third trenches 203.

According to an embodiment of the inventive concept, the third trenches 203 may be formed out of extension lines of the first trenches 201 and the second trenches 202. For example, the third trenches 203 may be formed between the first trenches 201 and the second trenches 202, as illustrated. A distance D4 between the second trench 202 and the third trench 203 may be shorter than the double of the etching depth D3 in the horizontal etching. When these conditions are satisfied, the recessed regions 210 and the conductive patterns CP formed around the second trenches 202 may be connected to each other.

According to an embodiment of the inventive concept, the sidewall molds 145 are formed between the third trenches 203 in the connection region CNR and thus may serve as supporting elements that structurally support the interlayer molds 120. The sidewall molds 145 serving as the support elements are configured to prevent a technical difficulty such as the distances between the interlayer molds 120 being vertically changed in the connection region CNR during the horizontal etching.

The conductive patterns around the second trenches 202 may be connected to each other by openings with deformed shape and arrangement of the third trenches 203. That is, the technical spirit of the inventive concept is not limited to the third trenches 203 illustrated as examples in FIGS. 16A and 16B, but may be modified in various forms.

[Some Aspects of Technical Spirit of Inventive Concept]

Figure 17:
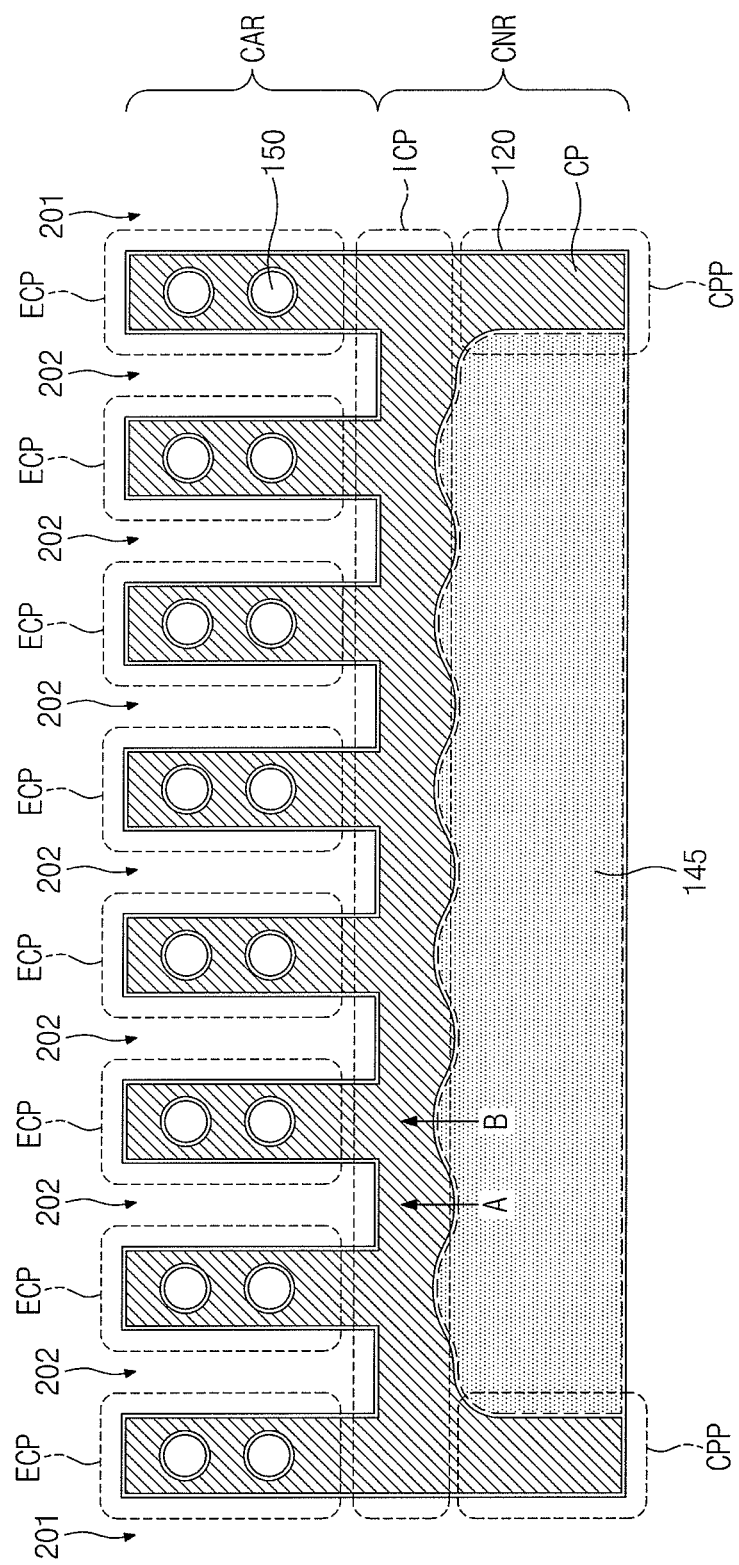
FIGS. 17 and 18 are a plan view and a perspective view for explaining some aspects of the technical spirit of the inventive concept in more detail.
Figure 18:
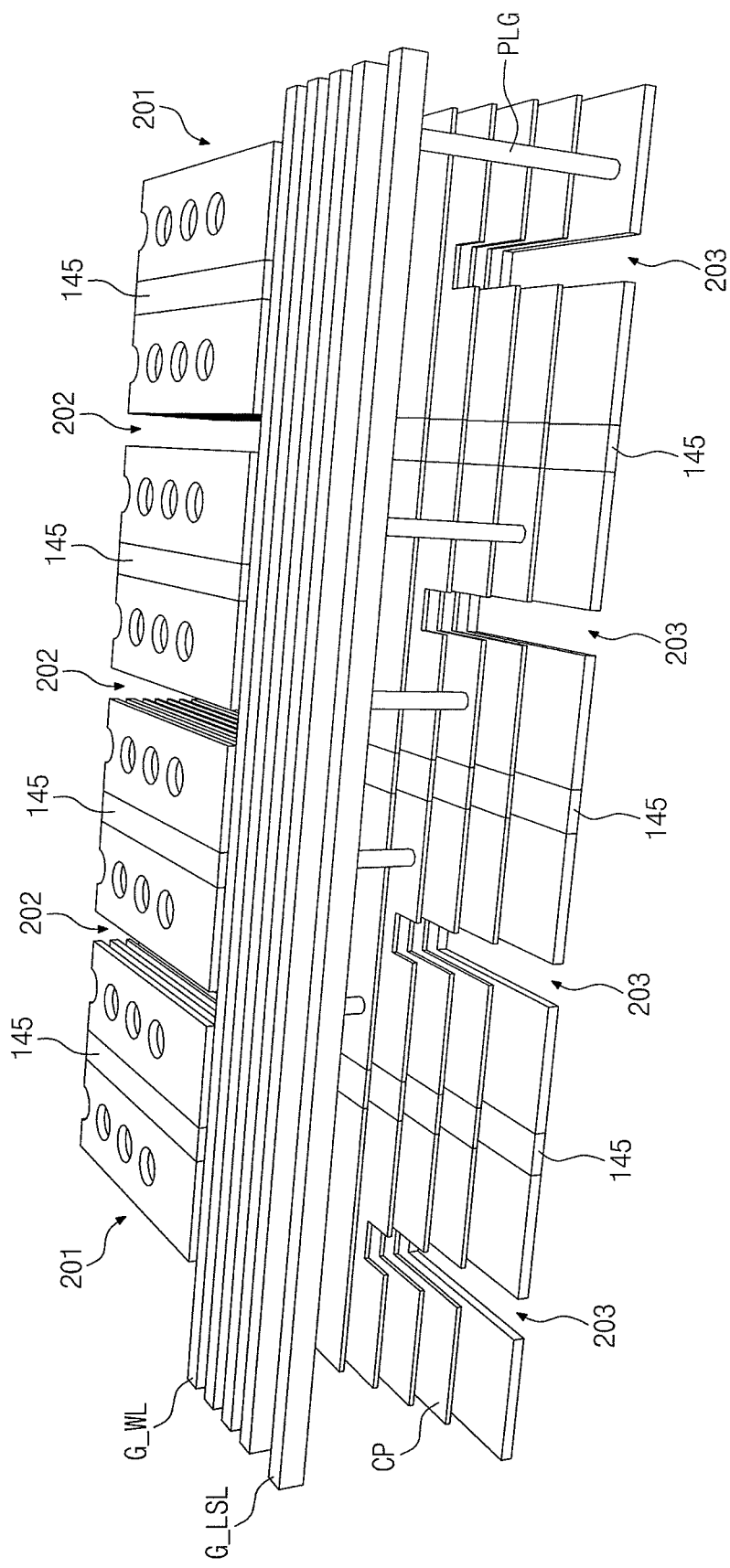
Figure 19:
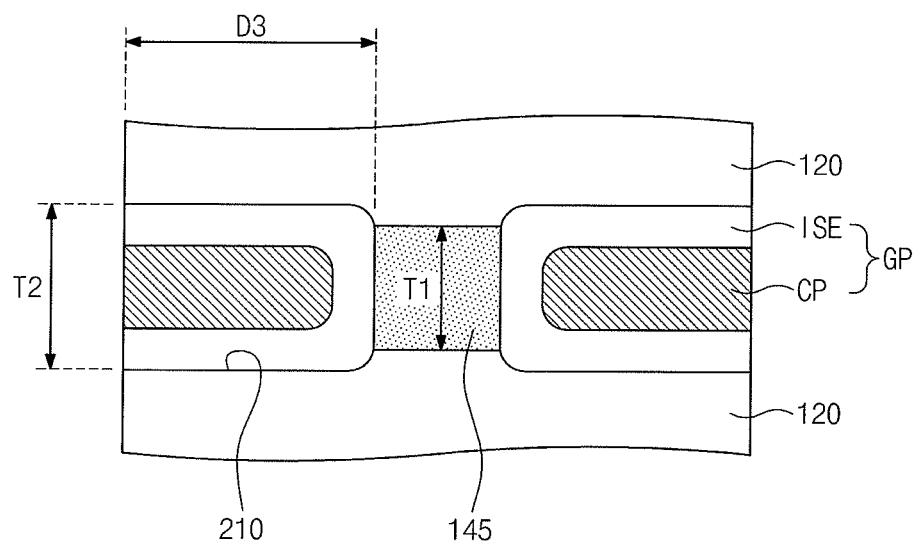
FIG. 19 is a sectional view for explaining other aspects of the technical spirit of the inventive concept in more detail.

FIGS. 17 and 18 are a plan view and a perspective view for explaining some aspects of the technical spirit of the inventive concept in more detail. FIG. 19 is a sectional view for explaining other aspects of the technical spirit of the inventive concept in more detail.

Referring to FIG. 17, the conductive pattern CP may include a plurality of electrode portions ECP, at least one interconnecting portion ICP, and at least one contact pad portion CPP in the three-dimensional semiconductor device according to the technical spirit of the embodiment of the inventive concept.

The electrode portions ECP are arranged so as to face the active patterns 180 in the cell array region CAR and thus may be used as electrodes controlling the potential of the active pattern 180. According to embodiments of a three-dimensional Flash memory, the electrode portions ECP may be used as control gate electrodes or word lines.

The interconnecting portion ICP may connect the electrode portions ECP in the connection region CNR or near the boundary between the cell array region CAR and the connection region CNR. That is, the plurality of electrode portions ECP arranged at the same height from the substrate 100 may be connected to each other by the interconnecting portions ICP and thus may be placed in equipotential state.

The contact pad portion CPP may be horizontally protruded from the interconnecting portion ICP. The area of the contact pad portion CPP may become different depending on the lamination position of the conductive pattern CP. That is, as illustrated in FIGS. 15C and 15D, the distance between the substrate 100 and the conductive pattern CP increases, as the area of the contact pad portion CPP decreases.

According to an embodiment of the inventive concept, the contact pad portion CPP may be formed so as to be adjacent to the first trenches 201. In this case, as illustrated in FIGS. 15C and 17, one conductive pattern CP may include two contact pad portions CPP formed closely in both ends of the interconnecting portion ICP.

According to another embodiment of the inventive concept, as illustrated in FIG. 18, parts of the conductive pattern adjacent to the third trenches 203 may also be used as the contact pad portions CPP. In this case, one conductive pattern CP may include several contact pad portions CPP. As the number of contact pad portions CPP is increased, plugs PLG may be arranged at a larger gap to connect the conductive pads CP electrically to the global interconnection structure (G_WL or G_LSL). Due to the increase in the margin in the gap between the plugs PLG, it is possible to alleviate the technical difficulty to connect the conductive pattern CP electrically to the global interconnection structure (G_WL or G_LSL).

According to embodiments of the inventive concept, as illustrated in FIG. 17, the boundary surface between the interconnection pattern ICP and the contact pad portion CPP may be formed in an uneven shape. That is, the conductive pattern CP and the sidewall mold 145 may have uneven sidewalls engaging with each other. More specifically, since the horizontal etching is performed by an isotropic etching process, the preliminary wide mold 140 may be etched more deeply in region A adjacent to the second trenches 202 than in region B spaced from the second trenches 202. As a consequence, the conductive pattern CP and the sidewall mold 145 may have the sidewalls engaging with each other.

FIG. 19 is a sectional view for explaining other aspects of the technical spirit of the inventive concept in more detail. Specifically, FIG. 19 is a sectional view taken along the line I-I of FIG. 16A.

Referring to FIG. 19, the horizontal etching described with reference to FIGS. 4 and 9 and FIGS. 14A through 14D may include etching the preliminary sidewall molds 140 horizontally using an etching recipe having an etch selectivity to the interlayer molds 120. In accordance with the etching recipe used in the horizontal etching, the interlayer molds 120 may also be etched, while the preliminary sidewall molds 140 are etched horizontally.

More specifically, according to the technical spirit of the inventive concept, a ratio of the etching speed of the preliminary sidewall molds 140 to that of the interlayer molds 120 may be in the range, for example, from about 10 to about 200. Then, the interlayer molds 120 may also be etched with, for example, a thickness from about $1/10$ to about $1/200$ of the etching depth D3 in the horizontal etching. As a consequence, the interlayer molds 120 may be thicker in a region adjacent to the sidewall mold 145 than in a region adjacent to the conductive pattern CP. That is, as illustrated in FIG. 19, a thickness T2 of the recessed region 210 may be thicker than a thickness T1 of the sidewall molds 145. The increase in the thickness T2 of the recessed region 210 may result in increasing the thickness of the conductive pattern CP and decreasing the resistance of the conductive pattern CP.

Figure 20:
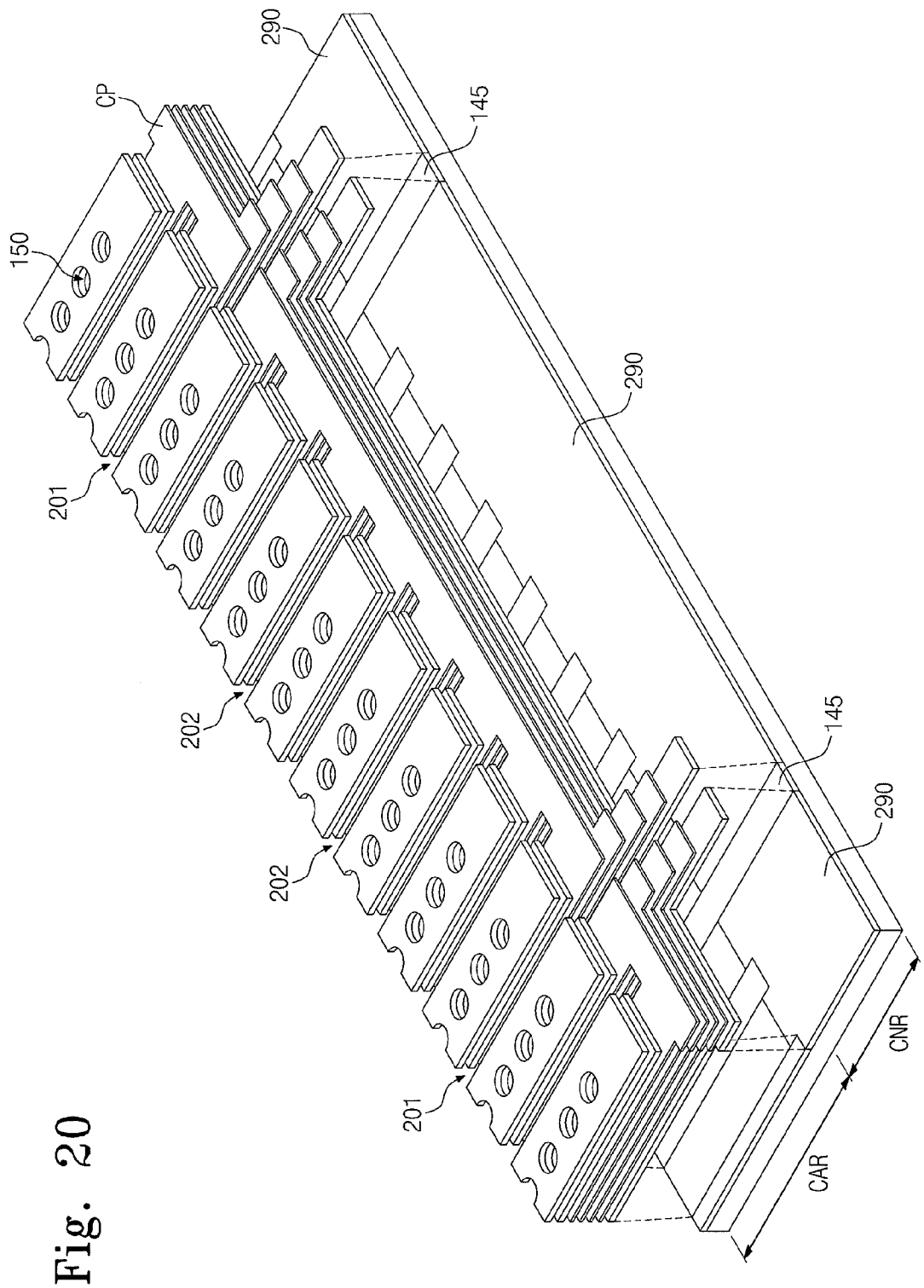
FIG. 20 is perspective view for explaining another modified example of the technical spirit of the inventive concept.

FIG. 20 is a perspective view for explaining another modified example of the technical spirit of the inventive concept.

According to the above-described embodiments of the inventive concept, the arrangement of the common source lines CSL is defined by the trenches 201 and 202. Therefore, the common source lines may be isolated from each other. According to the modified example of the inventive concept, as illustrated in FIG. 20, a global source region 290 may be formed to connect the common source lines CSL in the connection region CNR of the substrate 100. The global source region 290 may be formed, before the interlayer molds 110 described with reference to FIGS. 1 and 10 are formed. The arrangement of the global source region 290 may be modified in various forms of the illustrated configuration.

Figure 21:
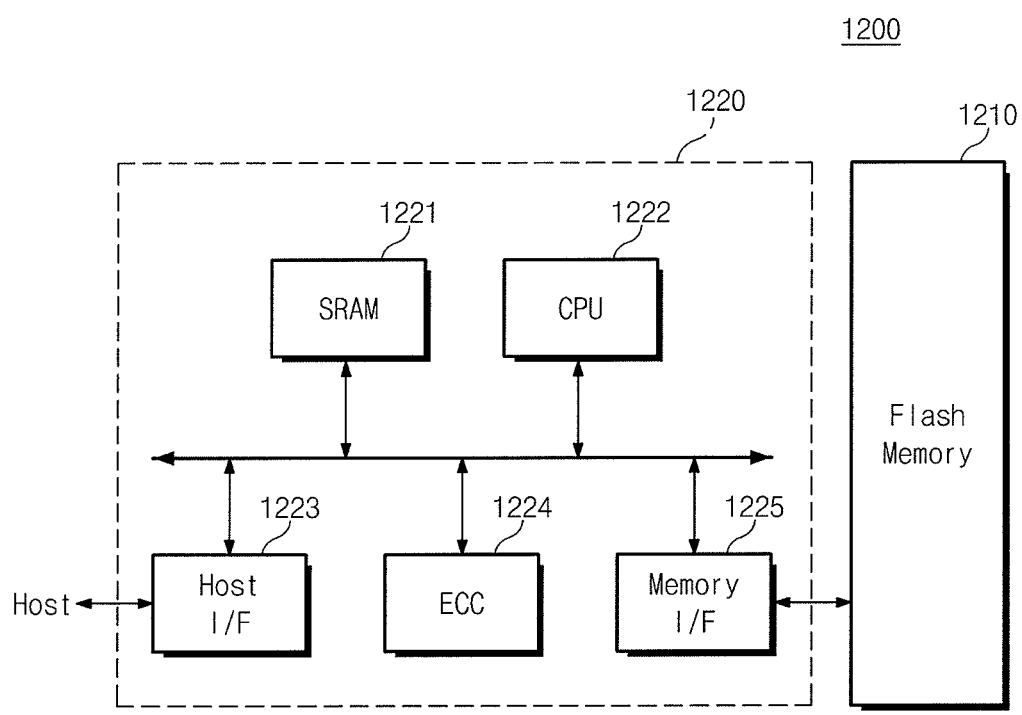
FIG. 21 is a schematic block diagram illustrating an exemplary memory card including a Flash memory device according to the inventive concept.

FIG. 21 is a schematic block diagram illustrating an exemplary memory card 1200 including a Flash memory device according to the embodiments of the inventive concept. Referring to FIG. 21, a memory card 1200 supporting a large data storing ability is mounted with a Flash memory device 1210 according to the inventive concept. The memory card 1200 according to the inventive concept includes a memory controller 1220 generally controlling data exchange between a host and the Flash memory device 1210.

An SRAM 1221 is used as an operational memory of a processing unit 1222. A host interface 1223 has a data exchange protocol of a host connected to the memory card 1200. An error correction coding block 1224 detects and corrects an error contained in data read from the multi-bit Flash memory device 1210 with a multi-bit characteristic. A memory interface 1225 interfaces the Flash memory device 1210 according to the inventive concept. The processing unit 1222 generally controls data exchange of the memory controller 1220. Although not illustrated in the drawing, it is apparent to those skilled in the art that the memory card 1200 according to the inventive concept may further include a ROM (not illustrated) storing coding data used to interface the host.

According to the Flash memory device, the memory card, or the memory system according to the inventive concept, it is possible to provide the memory system with high reliability by the Flash memory device 1210 improved in an erasing characteristic of dummy cells. For example, the Flash memory device according to the inventive concept may be provided in a memory system such as a solid state drive (SSD), which has actively been developed. In this case, it is possible to realize a memory system with high reliability by blocking a reading error caused from the dummy cells.

Figure 22:
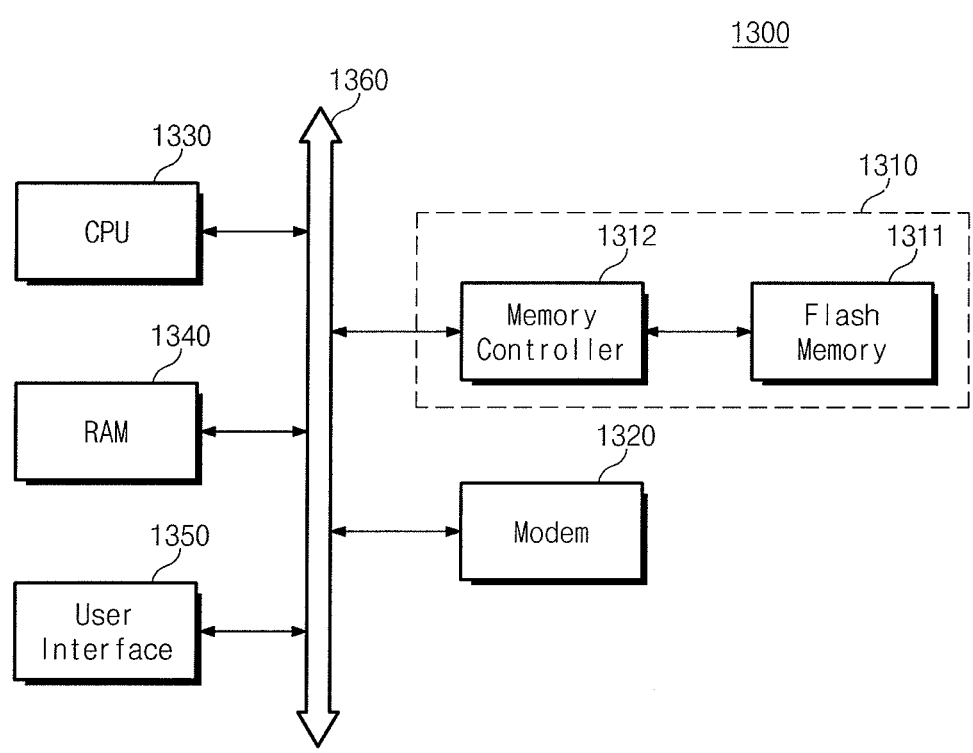
FIG. 22 is a schematic block diagram illustrating an information processing system including a Flash memory system according to the inventive concept.

FIG. 22 is a schematic block diagram illustrating an information processing system 1300 including a Flash memory system 1310 according to the inventive concept. Referring to FIG. 22, the Flash memory system 1310 according to the inventive concept is mounted in an information processing system such as, for example, a mobile device or a desktop computer. The information processing system 1300 according to the inventive concept includes a modem 1320, a central processing unit 1330, a RAM 1340, and a user interface 1350 electrically connected to the Flash memory system 1310 via a system bus 1360. The Flash memory system 1310 may have substantially the same configuration as that of the memory system or the Flash memory system mentioned above. The Flash memory system 1310 stores data processed by the central processing unit 1330 or data input from the outside. In the present embodiment, the Flash memory system 1310 includes a flash memory 1311 and a memory controller 1312. Here, the above-described Flash memory system 1310 may be formed as a semiconductor disk device (SSD). In this case, the information processing system 1300 may stably store large data in the Flash memory system 1310. Since the resource necessary for error correction may be saved with an increase in reliability in the Flash memory system 1310, a high-speed data exchanging function may be realized in the information processing system 1300. Although not illustrated, it is apparent to those skilled in the art that, for example, an application chipset, a camera image signal processor (ISP), an input/output device, or the like may further be included in the information processing system 1300 according to the inventive concept.

The Flash memory device or the memory system according to the inventive concept may be mounted in various types of packages. For example, the Flash memory device or the memory system according to the inventive concept may be packaged in a packaging way such as package on package (PoP), ball grid array (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline package (TSOP), thin quad flat pack (TQFP), system in package (SIP), multi chip package (MCP), wafer-level fabricated package (WFP), or wafer-level processed stack package (WSP).

According to the embodiments of the inventive concept, the mold structure defining the recessed regions may be used as a mold for forming interconnections arranged three-dimensionally. The mold structure may include the interlayer molds sequentially stacked and the sidewall molds interposed between the interlayer molds. The sidewall molds and the interlayer molds define the recessed regions and the sidewall molds may also prevent a technical difficulty such as the gap between the interlayer molds being changed during the formation of the recessed regions (that is, the deformation of the mold structure). Accordingly, the structural stability of the recessed regions and the interconnections can be enhanced without forming a additional supporting element to prevent the deformation of the mold structure.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A three-dimensional semiconductor device comprising:
   a substrate comprising a cell array region and a connection region;
   a mold structure providing gap regions;
   an interconnection structure comprising a plurality of interconnection patterns formed in the gap regions;
   a plurality of active patterns penetrating through the mold structure and are connected to the substrate; and
   an information storing element interposed between sidewalls of the active pattern and the interconnection pattern,
   wherein the mold structure comprises interlayer molds defining upper surfaces and lower surfaces of the interconnection patterns and sidewall molds defining sidewalls of the interconnection patterns in between the interlayer molds, and
   wherein the sidewall molds are formed of an insulating material having an etch selectivity with respect to the interlayer molds,
   wherein the information storing element extends from between the sidewalls of the active pattern and the interconnection pattern to between sidewalls of the interconnection pattern and the sidewall mold.

2. The three-dimensional semiconductor device of claim 1, wherein the interlayer molds are thicker in a region adjacent to the sidewall mold than in a region adjacent to the interconnection pattern, and the width of the interlayer mold is broader than a width of the sidewall mold.

3. The three-dimensional semiconductor device of claim 1, wherein the sidewall mold and the interconnection pattern most adjacent thereto are formed at the substantially same level from the substrate.

4. The three-dimensional semiconductor device of claim 1, further comprising: an impurity region formed in the substrate between the interconnection patterns,
   wherein the impurity region is formed apart from a part of the substrate located below the sidewall molds.

5. The three-dimensional semiconductor device of claim 1, wherein the interconnection patterns comprise at least one of metal materials, and
   the information storing element comprises a charge storing layer.

6. The three-dimensional semiconductor device of claim 1, wherein the information storing element extends horizontally from a space between the sidewalls of the active pattern and the interconnection pattern to cover upper surfaces and lower surfaces of the interconnection patterns.

7. The three-dimensional semiconductor device of claim 6, wherein the information storing element extends from the upper surfaces and the lower surfaces of the interconnection patterns and the information storing element is disposed between sidewalls of the interconnection pattern and the sidewall mold, thereby separating the interconnection patterns from the sidewall mold.

8. The three-dimensional semiconductor device of claim 1, wherein the mold structure comprises a plurality of partial mold structures spaced horizontally apart from each other in the cell array region, and the interconnection structure comprises a plurality of partial interconnection structures comprising the plurality of interconnection patterns sequentially stacked, and wherein two partial interconnection structures separated horizontally by the sidewall molds are disposed in one partial mold structure.

9. The three-dimensional semiconductor device of claim 1, wherein a width of the sidewall mold pattern is smaller than a distance between an adjacent two of the active patterns.

10. The three-dimensional semiconductor device of claim 1, wherein the interconnection structure further comprises connection patterns sequentially stacked in the connection region, and each of the connection patterns comprises:
    an interconnecting portion horizontally connecting the interconnection patterns; and
       a contact pad portion horizontally protruding from the interconnecting portion, wherein areas of the contact pad portions of the connection patterns decreases as a distance between the connection pattern and the substrate increases.

11. The three-dimensional semiconductor device of claim 10, wherein the interconnecting portion connects a portion of the interconnection patterns to each other, and the contact pad portion has a major axis parallel to major axes of the interconnection patterns, wherein widths of the contact pad portions measured along a direction intersecting the major axes of the interconnection patterns are substantially the same as each other.

12. The three-dimensional semiconductor device of claim 10, wherein a number of contact pad portions included in each of the connection patterns is two.

13. The three-dimensional semiconductor device of claim 10, wherein the interconnection structure comprises at least two interconnection patterns, one interconnecting portion, and at least two contact pad portions.

14. The three-dimensional semiconductor device of claim 10, wherein a width of the contact pad portion measured along a direction intersecting major axes of the interconnection patterns is substantially the same as a width of the interconnecting portion measured along a direction of the major axis of the interconnection pattern.

15. The three-dimensional semiconductor device of claim 10, wherein a width of the contact pad portion measured along a direction intersecting major axes of the interconnection patterns is substantially the same as a width of the interconnection pattern.

16. The three-dimensional semiconductor device of claim 10, wherein the sidewall molds comprises outer molds sequentially stacked in the connection region, and an area of the outer mold decreases as a distance between the outer mold and the substrate increases.

17. The three-dimensional semiconductor device of claim 16, wherein a length of the outer mold measured along a direction parallel to a major axis of the interconnection pattern decreases as a distance between the outer mold and the substrate increases, and a length of the outer mold measured along a direction intersecting the major axes of the interconnection patterns are substantially the same as each other.

18. The three-dimensional semiconductor device of claim 16, wherein lengths of the outer molds and the contact pad portions at the same height, which are measured along a direction intersecting major axes of the interconnection patterns are substantially the same as each other.

19. A three-dimensional semiconductor device comprising:
 a substrate;
 at least one mold structure disposed on the substrate and providing gap regions, the at least one mold structure comprising a plurality of partial mold structures;
 partial interconnection structures comprising a plurality of interconnection patterns which are sequentially stacked;
 a plurality of active patterns penetrating through the mold structure and are connected to the substrate; and
 an information storing element interposed between sidewalls of the active pattern and the interconnection pattern,
 wherein the interconnection patterns are disposed in the gap regions, respectively, and the mold structure comprises interlayer molds vertically isolating the interconnection patterns and sidewall molds horizontally isolating the interconnection patterns,
 wherein the sidewall molds are formed of an insulating material having an etch selectivity with respect to the interlayer molds, and
 wherein two partial interconnection structures are disposed in one partial mold structure,
 wherein the information storing element extends from between the sidewalls of the active pattern and the interconnection pattern to between sidewalls of the interconnection pattern and the sidewall mold.

* * * * *